United States Patent
Oshima et al.

(10) Patent No.: US 9,276,398 B2
(45) Date of Patent: Mar. 1, 2016

(54) PROTECTIVE SEMICONDUCTOR DEVICE FOR SECONDARY CELL

(71) Applicants: Masashi Oshima, Yokohama (JP); Kuniaki Arai, Tokyo (JP); Junichi Kanno, Yokohama (JP)

(72) Inventors: Masashi Oshima, Yokohama (JP); Kuniaki Arai, Tokyo (JP); Junichi Kanno, Yokohama (JP)

(73) Assignee: RICOH COMPANY, LTD., Tokyo (JP)

( * ) Notice: Subject to any disclaimer, the term of this patent is extended or adjusted under 35 U.S.C. 154(b) by 414 days.

(21) Appl. No.: 13/798,888

(22) Filed: Mar. 13, 2013

(65) Prior Publication Data
US 2013/0242446 A1    Sep. 19, 2013

(30) Foreign Application Priority Data
Mar. 19, 2012    (JP) ................................ 2012-062329

(51) Int. Cl.
| H02J 7/00 | (2006.01) |
| H02H 3/20 | (2006.01) |
| H01M 10/48 | (2006.01) |
| G01R 31/36 | (2006.01) |
| G01R 19/165 | (2006.01) |

(52) U.S. Cl.
CPC ............ *H02H 3/207* (2013.01); *H01M 10/482* (2013.01); *H02J 7/0016* (2013.01); *G01R 19/16542* (2013.01); *G01R 31/362* (2013.01); *G01R 31/3658* (2013.01)

(58) Field of Classification Search
USPC ....................................................... 320/134
See application file for complete search history.

(56) References Cited

U.S. PATENT DOCUMENTS

| 7,800,342 | B2 * | 9/2010 | Kobayashi et al. ........... 320/118 |
| 8,030,893 | B2 | 10/2011 | Nakatsuji |
| 2004/0036446 | A1 | 2/2004 | Iwashima |
| 2004/0149740 | A1 | 8/2004 | Kishi et al. |
| 2006/0091130 | A1 | 5/2006 | Kishi et al. |
| 2006/0139008 | A1 | 6/2006 | Park |
| 2007/0183806 | A1 | 8/2007 | Kishi et al. |
| 2009/0051324 | A1 | 2/2009 | Nakatsuji |
| 2009/0130542 | A1 * | 5/2009 | Mizoguchi et al. ............. 429/61 |
| 2011/0079873 | A1 | 4/2011 | Oshima et al. |

FOREIGN PATENT DOCUMENTS

| CN | 1790857 | 6/2006 |
| CN | 101421883 | 4/2009 |

(Continued)

OTHER PUBLICATIONS

Chinese official action dated Dec. 22, 2014 and English translation in corresponding Chinese patent application No. 2013 10 08 8448.9.

*Primary Examiner* — Robert Grant
(74) *Attorney, Agent, or Firm* — Cooper & Dunham LLP

(57) ABSTRACT

Provided is a protective semiconductor device detecting a disconnection reliably with secondary cells including for each cell: cell-connecting terminals; a first resistance detecting the voltage of each cell; a comparator detecting whether or not the voltage of each cell is in the reference voltage range; a series circuit composed of a second resistance and a first switch element, and including a control circuit controlling ON/OFF of the switch element, wherein the first switch element connects the second resistance to the connecting terminals by turning ON, while disconnecting it by turning OFF, the control circuit maintains a disconnection test signal ON, while turning ON the plurality of first switch elements sequentially and detecting the disconnection between the cells and the connecting terminals based on the output signal from the comparator corresponding to the first switch element turned ON.

6 Claims, 14 Drawing Sheets

(56) References Cited

FOREIGN PATENT DOCUMENTS

| CN | 201429678 | 3/2010 |
|---|---|---|
| JP | 2004-104989 | 4/2004 |
| JP | 2008-27658 | 2/2008 |
| JP | 2008-027658 | 2/2008 |
| JP | 2008-250353 | 11/2009 |
| JP | 2011-077466 | 4/2011 |
| WO | WO2012/008509 A1 | 1/2012 |

* cited by examiner

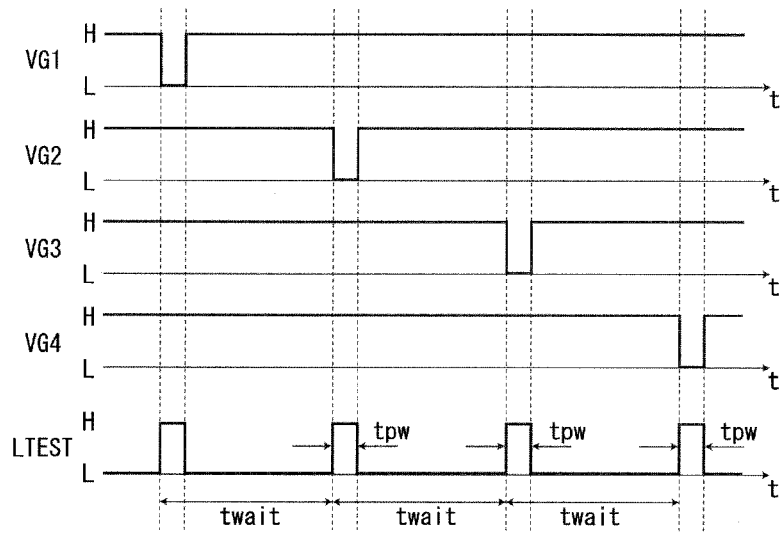
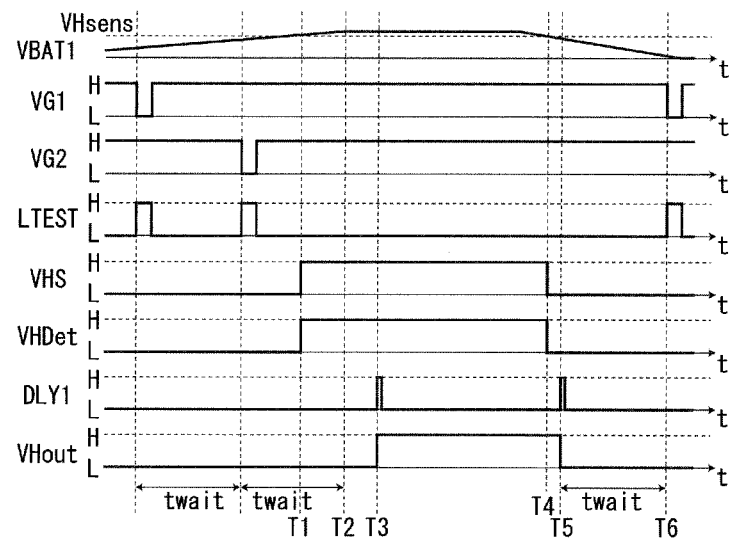

PROTECTIVE SEMICONDUCTOR DEVICE FOR SECONDARY CELL

CROSS-REFERENCE TO RELATED APPLICATION

The present application is based on and claims priority from Japanese Application Number, 2012-062329, filed on Mar. 19, 2012, the disclosure of which is hereby incorporated by reference herein in its entirety.

BACKGROUND OF THE INVENTION

1. Field of the Invention

The present invention relates to a protective semiconductor device for a secondary cell.

2. Description of the Related Art

Battery packs, which are easy to handle, have been widely used for mobile electronic devices. Such battery packs are formed of a package in which one or more secondary cells are contained. As the secondary cell, a high-capacity battery such as a lithium-ion battery, a lithium polymer battery, a nickel hydride battery, and so on is used. There is a possibility of evolution of high-temperature heat leading to ignition if an overcharge, an over discharge, an excess current, and so on are generated, since these high-capacity batteries have a high amount of energy therein.

Hence, a protective semiconductor device to prevent the occurrence of overcharge, over discharge, charge-excess current, discharge-excess current, short-circuit current, abnormal overheating, and so on is contained in the battery pack of the secondary cell. The protective semiconductor device also prevents deterioration of the secondary cell, while preventing evolution of heat and ignition from occurring by blocking the connection with the charger or the load device if necessary.

In recent years, a protective semiconductor device which protects a plurality of the secondary cells used by connecting them in series has been developed. However, in conventional protective semiconductor devices which protect the plurality of the secondary cells used by connecting them in series, there is a problem in that the a disconnection cannot be detected when generated at a part of a connection between the secondary cells and the protective semiconductor device.

In Japanese Patent Application Publication No. 2008-027658 (Patent Document 1), a method to compare a cell voltage when charge-discharge current is flowing with the one when the current is not flowing in order to detect the disconnection between the secondary cells and the protective semiconductor device is disclosed. However, by the method such as disclosed in Patent Document 1, the disconnection of the connection between the secondary cells and the protective semiconductor device which arises while using the secondary cells cannot be detected.

SUMMARY OF THE INVENTION

An object of the present invention is to provide a protective semiconductor device which detects an occurrence of a disconnection reliably if a part of the connection between the secondary cells and the protective semiconductor device is disconnected.

To accomplish the above object, a protective semiconductor device according to one embodiment of the present invention is a protective semiconductor device capable of detecting a voltage state of a plurality of secondary cells connected in series, comprising connecting terminals which are connectable to an electrode of each secondary cell, first resistances detecting the voltage of each of secondary cells which are arranged corresponding to each secondary cell and connected between the terminals corresponding to each electrode of a high-pressure side and low-pressure side, comparators which are arranged corresponding to each secondary cell and capable of detecting whether or not the voltage of each of the secondary cells is in a reference voltage range based on the voltages obtained from the first resistances, series circuits each composed of a second resistance and a first switch element which are arranged corresponding to each secondary cell and connected between the connecting terminals, and a control circuit controlling ON/OFF of the each first switch element. The first switch element connects the second resistance between the connecting terminals by turning ON, while disconnecting the second resistance from the connecting terminals by turning OFF. The control circuit turns ON the plurality of first switch elements sequentially while remaining in an ON-state of a disconnection test signal and detects the disconnection between the secondary cells and the connecting terminals based on the output signal from the comparator corresponding to the first switch element turned ON.

BRIEF DESCRIPTION OF THE DRAWINGS

FIG. 2 is a diagram illustrating an example of a control signal of the control circuit in the protective semiconductor device according to the first embodiment of the invention;

FIG. 3 is an operation timing diagram of the protective semiconductor device according to the first embodiment of the invention operating the detection of high-voltage;

DETAILED DESCRIPTION OF THE PREFERRED EMBODIMENTS

Preferred embodiments of the present invention will be described hereinafter with reference to the accompanying drawings.

First Embodiment

A first embodiment of the present invention relates to a protective semiconductor device that protects a plurality of secondary cells connected in series and has the following configuration.

The protective semiconductor device includes a voltage-sense resistance connected in parallel with the secondary cells to monitor a voltage. A resistance which has a smaller resistance value than that of the voltage-sense resistance is temporarily connected in parallel with the voltage-sense resistance at constant time intervals. If a disconnection between the protective semiconductor device and the secondary sell is not generated, the fluctuation in voltage by the secondary cell is not generated at a connecting terminal of the protective semiconductor device, connected to the secondary sell. On the other hand, if the disconnection between the protective semiconductor device and the secondary sell is generated, voltage fluctuates along with the fluctuation in the resistance value caused by temporal formation of the parallel resistance mentioned above at the connecting terminal disconnected from the secondary cell. The protective semiconductor device detects the fluctuation in voltage generated along with a change in resistance as being due to the disconnection.

1.1. Configuration of the Protective Semiconductor Device

Figure 1:
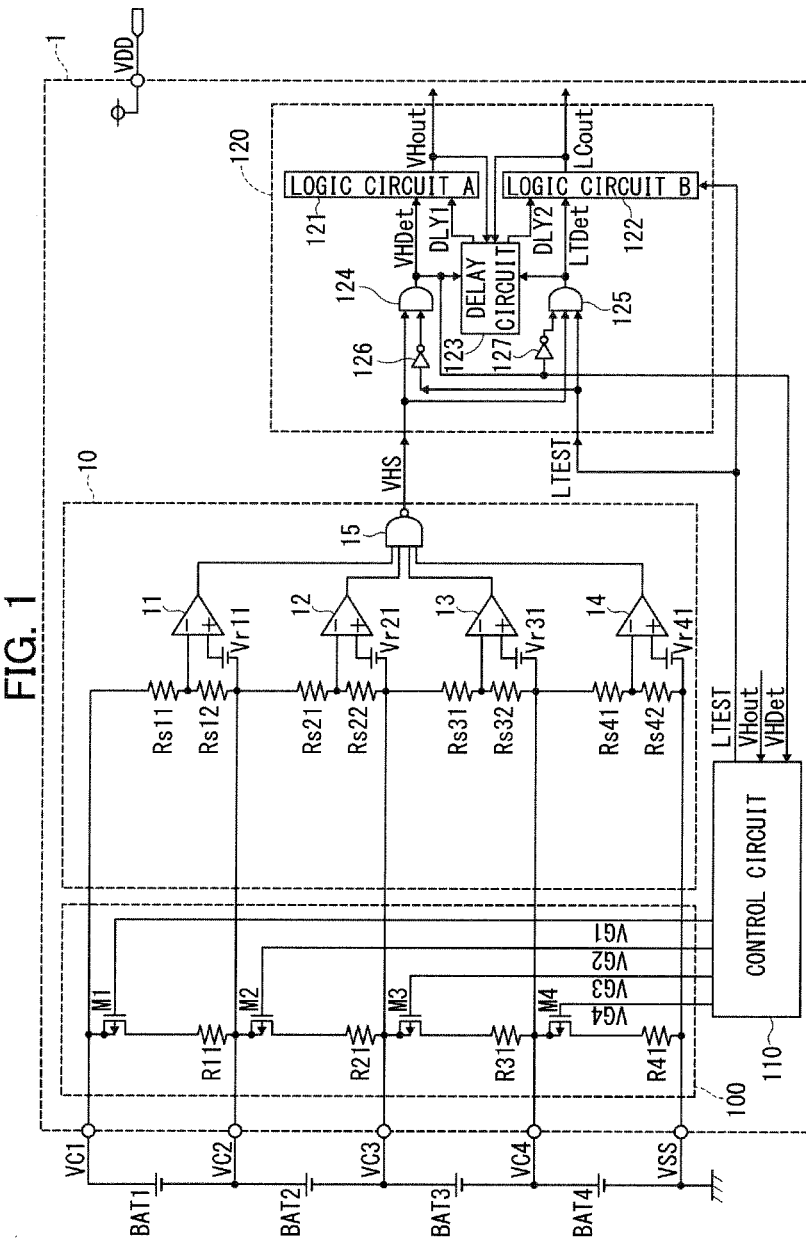
FIG. 1 is a schematic diagram of the protective semiconductor device according to the first embodiment of the invention and the secondary cells.

FIG. 1 is the schematic diagram of a protective semiconductor device 1 according to the first embodiment of the invention and the secondary cells. The protective semiconductor device 1 includes a malfunction-detecting circuit 10 which performs the detection of high-voltage and disconnection, an internal-resistance-changing circuit 100, a control circuit 110, and a judging circuit 120. Note that, the malfunction-detecting circuit 10 may include a low-voltage-detecting circuit, an excess current-detecting circuit, and so on. Further, the number of the secondary cells is four in the schematic diagram shown in FIG. 1, but the number of the secondary cells intended by the protective semiconductor device according to the first embodiment is not limited to this number.

The protective semiconductor device 1 includes cell-connecting terminals VC1 to VC4 and an earth terminal VSS to connect to four secondary cells. A positive electrode of a first secondary cell BAT1 is connected to the cell-connecting terminal VC1, and a negative electrode of the first secondary cell BAT1 and a positive electrode of a second secondary cell BAT2 are connected to the cell-connecting terminal VC2. A negative electrode of the second secondary cell BAT2 and a positive electrode of a third secondary cell BAT3 are connected to the cell-connecting terminal VC3. A negative electrode of the third secondary cell BAT3 and a positive electrode of a fourth secondary cell BAT4 are connected to the cell-connecting terminal VC4. A negative electrode of the fourth secondary cell BAT4 is connected to the earth terminal VSS. A supply terminal VDD is connected to a power source of the circuit (not shown) and the cell-connecting terminal VC1.

The malfunction-detecting circuit 10 is a circuit detecting a high-voltage of the secondary cells or disconnection between the secondary cells and the protective semiconductor device 1. The malfunction-detecting circuit 10 is composed of comparators 11, 12, 13, 14, reference voltages Vr11, Vr21, Vr31, Vr41, partial resistances Rs11, Rs12, Rs21, Rs22, Rs31, Rs32, Rs41, Rs42 and a NAND circuit 15. Of them, the comparator 11, the resistances Rs11, Rs12 and the reference voltage Vr11 configure a circuit detecting the high-voltage and the disconnection of the secondary cell BAT1. The resistances Rs11 and Rs12 are connected in series and between the cell-connecting terminals VC1 and VC2. A connection node of the resistances Rs11 and Rs12 is connected to an inverting input of the comparator 11. The reference voltage Vr11 is connected between a non-inverting input of the comparator 11 and the cell-connecting terminal VC2. Note that, the resistances Rs11 and Rs12 are a voltage-sense resistance related to the first secondary-cell BAT1.

The malfunction-detecting circuits of the second secondary-cell BAT2 to the fourth secondary-cell BAT4 have same the configurations as the malfunction-detecting circuit of the first secondary-cell BAT1, and descriptions thereof are omitted.

All outputs of the comparators 11, 12, 13, 14 are connected to an input of the NAND circuit 15, and a detection signal VHS as an output from the NAND circuit 15 is connected to an input of a judging circuit 120.

The internal-resistance-changing circuit 100 is composed of PMOS transistors M1 to M4 and resistances R11 to R41. Of them, the PMOS transistor M1 and the resistance R11 configure the series circuit changing an internal-resistance corresponding to the first secondary cell BAT1 in order to detect the disconnection. The PMOS transistor M1 and the resistance R11 are connected in series, and further connected between the cell-connecting terminal VC1 and VC2. The control signal VG1 from the control circuit 110 is connected to a gate of the PMOS transistors M1.

The internal-resistance-changing circuits of the second secondary-cell BAT2 to the fourth secondary-cell BAT4 have the same configurations as the internal-resistance-changing circuit of the first secondary-cell BAT1, and descriptions thereof are omitted.

Resistance values of the resistances R11 to R 41 are identical and smaller than the resistance values of the resistances Rs11 to Rs42 forming a part of the malfunction-detecting circuit 10.

The control circuit 110 is inputted a high-voltage detecting-operation signal VHDet and a high-voltage detecting signal VHout, while outputting the control signals VG1, VG2, VG3, VG4 to the PMOS transistor M1 to M4 of the internal-resistance-changing circuit 100 respectively and a disconnection test signal LTEST to a logic circuit B 122. Moreover, a clock, an external trigger, and so on not shown in the drawings are connected to the control circuit 110 as an input in order to produce the control signal VG1 to VG4 and the disconnection test signal LTEST.

The judging circuit 120 is a circuit judging whether the malfunction-detecting circuit 10 has detected the high-voltage or the disconnection. The judging circuit 120 includes a logic circuit A 121, the logic circuit B 122, a delay circuit 123, an AND circuit 124, an AND circuit 125, an inverter circuit 126 and an inverter circuit 127.

The AND circuit 124 is inputted the detection signal VHS as an output from the malfunction-detecting circuit 10 and the disconnection test signal LTEST which is inverted by the inverter circuit 126, while outputting the high-voltage detecting-operation signal VHDet. The AND circuit 125 is inputted the detection signal VHS as an output from the malfunction-detecting circuit 10, the disconnection test signal LTEST and the high-voltage detecting-operation signal VHDet which is inverted by the inverter circuit 127, while outputting the disconnection detecting-operation signal LTDet. By the effect of these AND circuits 124 and 125, the detection of high-voltage is not performed while the detection of disconnection is being performed, and the detection of disconnection is not performed while the detection of high-voltage is being performed.

The logic circuit A 121 is inputted the high-voltage detecting-operation signal VHDet and a delayed output DLY1 from the delay circuit 123, while outputting the high-voltage detecting signal VHout to the delay circuit 123 and an internal circuit (not shown).

The logic circuit B 122 is inputted the disconnection detecting-operation signal LTDet and the delayed output DLY2 from the delay circuit 123, while outputting a disconnection-detecting signal LCout to the delay circuit 123 and the internal circuit (not shown).

The delay circuit 123 is inputted the high-voltage detecting-operation signal VHDet, the disconnection detecting-operation signal LTDet, the high-voltage detecting signal VHout and the disconnection-detecting signal LCout. Moreover, the delay circuit 123 outputs the delayed output DLY1 to the logic circuit A 121, and the delayed output DLY2 to the logic circuit B 122.

The judging circuit 120 can have any configuration as long as it judges whether the high-voltage or the disconnection has been detected.

The delay circuit 123 is a circuit to configure a delay time of the detecting/returning to prevent a false detection by noise and so on. When the malfunction-detecting circuit 10 has detected the high-voltage, the delay circuit 123 starts performing once the signal VHDet which is output from the AND circuit 124 turns from "L" to "H", and outputs an H-pulse to the output DLY1 if the signal VHDet is "H" until the end of the predetermined period. To return from the high-voltage-detecting mode, the delay circuit 123 starts performing once the signal VHDet, output from the AND circuit 124, turns from "H" to "L", and outputs the H-pulse if the signal VHDet is "L" until the end of the predetermined period. A judgment of the detecting/returning is performed based on the high-voltage detecting signal VHout. For example, the high-voltage detecting signal VHout "H" is judged as "detecting" and "L" is judged as "returning".

When the malfunction-detecting circuit 10 has detected the disconnection, the delay circuit 123 starts performing once the disconnection detecting-operation signal LTDet, output from the AND circuit 125, turns from "L" to "H", and outputs an H-pulse to the delayed output DLY2 if the signal LTDet is "H" until the end of the predetermined period. To return from the disconnection-detecting mode, the delay circuit 123 starts performing once the disconnection detecting-operation signal LTDet, output from the AND circuit 125, turns from "H" to "L", and outputs the H-pulse if the disconnection detecting-operation signal LTDet is "L" until the end of the predetermined period. A judgment of the detecting/returning is performed based on the disconnection-detecting signal LCout. For example, the disconnection-detecting signal LCout "H" is judged as "detecting" and "L" is judged as "returning".

Note that, these predetermined periods for the high-voltage detecting time, the returning time from high-voltage, the disconnection detecting and the returning time from disconnection need not be the same, and can be different each other. Furthermore, the delay circuit 123 can have any configuration such as a counter and a capacitance charging with constant-current if the circuit works in the same way.

1.2. Operation of the Protective Semiconductor Device at the Time of the Detection of Disconnection FIG. 2 illustrates an example of the control signal of the control circuit 110 in the protective semiconductor device according to the first embodiment. The operation of the protective semiconductor device will be described hereinafter based on the operation of the control circuit 110. The control circuit 110 produces the control signals VG1 to VG4 and the disconnection test signal LTEST based on an entered clock and so on in order to control a connection test between the secondary cells and the protective semiconductor device at a constant time interval twait.

As shown in FIG. 2, the control circuit 110 causes output from the disconnection test signal LTEST, which informs the judging circuit 120 that is under testing disconnection to turn to "H" during the time period width tpw at the constant time interval twait.

In regard to the control signals VG1 to VG4, one of them turns to "L" in tandem with the disconnection test signal LTEST and turns ON the PMOS transistors M1 to M4 connected to each of signals, and causes the resistances R11 to 41 to be connected in parallel to the voltage-sense resistance depending on these PMOS transistors M1 to M4 turned ON.

In the circuit shown in FIG. 1, it is assumed that the disconnection between the cell-connecting terminal VC2 and the secondary cells has arisen. At that time, it is assumed that the disconnection test signal LTEST turns to "H" state, and the control signal VG1 turns to "L". Then, in between the cell-connecting terminals VC1 and VC2, a series resistance is formed by connection between a first parallel resistance composed of a first series resistance, the resistances Rs11 and Rs12, and the resistance R11 (i.e., the series resistance is formed by the first parallel resistance and the second series resistance). If the resistances Rs11 and Rs12 are equal in value, and the resistances Rs12 and Rs22 are equal in value, the second series resistance is greater than the first parallel resistance in the resistance value.

Then, the voltage on the second series resistance (the resistances Rs21 and Rs22) becomes higher than before the disconnection has arisen between the cell-connecting terminal VC2 and the secondary cells. This "becoming higher" is detected by the comparator 12 and informed to the judging circuit 120 via the NAND circuit 15 as the "H" state of the detection signal VHS. At that time, the judging circuit 120 outputs the disconnection-detecting signal LCout as the "H" state responding to the disconnection test signal LTEST being in the "H" state.

It is also assumed that the disconnection test signal LTEST turns to "H" state, and the control signal VG2 turns to "L" with the cell-connecting terminal VC2 and the secondary cells disconnected. Then, in between the cell-connecting terminals VC1 and VC2, a series resistance is formed by connection between the second parallel resistance composed of the second series resistance, the resistances Rs21 and Rs22, and the resistance R21 (i.e., the series resistance is formed by the second parallel resistance and the first series resistance). At that time, the first series resistance is greater than the second parallel resistance in the resistance value.

Then, the voltage on the first series resistance (the resistances Rs11 and Rs12) becomes higher than before the disconnection has arisen between the cell-connecting terminal VC2 and the secondary cells. This "becoming higher" is detected by the comparator 11 and informed to the judging circuit 120 via the NAND circuit 15 as the "H" state of the detection signal VHS. At that time, the judging circuit 120 continues to output the disconnection-detecting signal LCout as the "H" state responding to the disconnection test signal LTEST being also in the "H" state.

If the disconnection has arisen between another cell-connecting terminal (e.g., the terminal VC3) and the secondary sells, the disconnection is detected in the same way, and the judging circuit 120 outputs the disconnection-detecting signal LCout as the "H" state.

Note that, the disconnection test interval twait and the disconnection-testing time period tpw can be any period, but the disconnection-testing time period tpw should be shorter than the delay time produced by the delay circuit 123.

Furthermore, the disconnection test interval twait testing the disconnection and the time period tpw that the disconnection test signal LTEST is in the "H" state can be generated in any way such that an external trigger input of the protective semiconductor device 1, an embedded oscillation circuit in the protective semiconductor device 1, and so on.

1.3. Operation of the Protective Semiconductor Device at the Time of the Detection of High-Voltage The high-voltage detecting operation of the protective semiconductor device of the present invention according to the first embodiment will be described hereinafter with reference to FIG. 3 and FIG. 1. FIG. 3 is the operation timing diagram of the protective semiconductor device according to the first embodiment at the time of the detection of high-voltage. In the timing diagram, only necessary signals for a description are shown. Hereinafter, the operation will be described in chronological order.

[Time T1:] Charging of the secondary cell is started at a certain point, and VBAT1, the voltage of the secondary cell BAT1, exceeds the high-voltage detecting level VHsens at the time T1.

The VHsens is expressed in a formula below.

$$VHsens = \frac{Rs11 + Rs12}{Rs12} \times Vr11 \quad \text{[Formula 1]}$$

Because the VBAT1, the voltage of the secondary cell BAT1, exceeds the high-voltage detecting level VHsens, output from the comparator 11 inverts and turns to "L", as a result, the detection signal VHS, output from the malfunction-detecting circuit 10, inverts and turns to "H". The AND circuit 124 in the judging circuit 120 inverts the high-voltage detecting-operation signal VHDet from "L" to "H" since the disconnection test is not in the process (output from the disconnection test signal LTEST is L). The AND circuit 125 in the judging circuit 120 leaves the disconnection detecting-operation signal LTDet "L" since the disconnection test is not in the process.

[Time T2:] The disconnection test interval twait elapses, but the control circuit 110 keeps from moving into the disconnection test process since the high-voltage detecting-operation signal VHDet is still "H". That is to say, the control circuit 110 leaves the disconnection test signal LTEST "L" as an output.

[Time T3:] Responding to the delay time to detect the high-voltage elapse, the delay circuit 123 outputs the H-pulse to the output DLY1, therefore, the logic circuit A 121 inverts the high-voltage detecting signal VHout from "L" to "H". The operation of the control circuit 110 is stopped by the high-voltage detecting signal VHout since the protective semiconductor device 1 comes to the high-voltage protection-detecting mode.

[Time T4:] When the VBAT1, the voltage of the secondary cell BAT1, decreases to the high-voltage detecting level VHsens or less, output from the comparator 11 inverts and turns to "H", as a result, the detection signal VHS, output from the malfunction-detecting circuit 10, inverts and turns to "L". The high-voltage detecting-operation signal VHDet also inverts and turns to "L" in tandem with the detection signal VHS.

[Time T5:] Responding to the delay time to return from the high-voltage-detecting mode having elapsed, the H-pulse is outputted from the output DLY1 which is output from the delay circuit 123, as a result the logic circuit A 121 inverts the high-voltage detecting signal VHout from "H" to "L". The performance of the control circuit 110 is restarted since the protective semiconductor device 1 is no longer in the high-voltage-detecting mode.

1.4. Summary of the First Embodiment

As stated above, in the first embodiment, in the protective semiconductor device for the secondary cells wherein the comparator detecting a fluctuation in voltage is installed to each of the secondary cells which are connected in series, the resistance is sequentially and temporarily connected to the resistances forming the comparators for each secondary cell. By detecting the fluctuation in voltage at the connecting terminals between the respective secondary cells which are parallel-connected and the protective semiconductor device by the comparators, it is possible to detect the disconnection between each secondary cell and the protective semiconductor device.

Second Embodiment

The protective semiconductor device according to the first embodiment of the invention has a problem with a false detection of the disconnection between the secondary cells and the protective semiconductor device even though no disconnection has arisen due to the generated voltage at both ends of the resistance forming a low-pass filter during the disconnection test, if the device is connected through a low-pass filter as a measure against noise. Therefore, the protective semiconductor device according to the second embodiment of the invention is characterized by reducing the false detection by the comparators, and the characteristics will be achieved in the following way. By connecting the resistances in series to each voltage-sense resistance of all the secondary cells respectively, while the resistance which has a smaller resistance value is temporarily connected in parallel to the voltage-sense resistance, the inversion level of the comparator connected with the voltage-sense resistance rises.

2.1. Aim of the Second Embodiment

Figure 4:
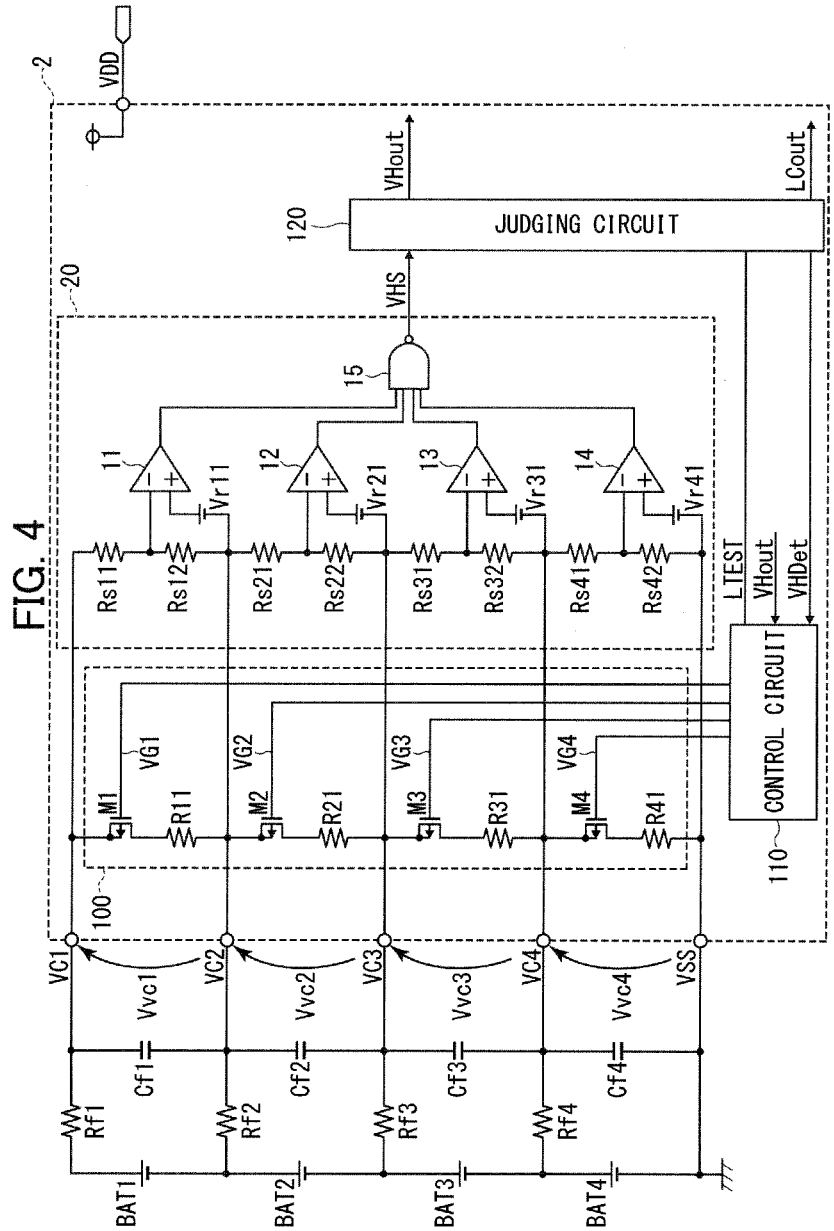
FIG. 4 is a practical schematic diagram of the protective semiconductor device according to only the first embodiment (namely, the second embodiment is not applied) of the invention and the secondary cells.

First, the aim of the second embodiment of the invention will be described. FIG. 4 is the practical schematic diagram of the protective semiconductor device according to only the first embodiment (namely, the second embodiment is not applied) of the invention and the secondary cells.

The protective semiconductor device in practical use is not connected directly to the secondary cells, but often connected through the low-pass filter as the measure against noise (formed by the resistances Rf1 to Rf4 and the capacitances Cf1 to Cf4) as shown in FIG. 4.

The problem which arises when the second embodiment is not applied will be described hereinafter with reference to FIG. 4. The problem is, namely, the disconnection between the secondary cells and a protective semiconductor device 2 can be detected even though no disconnection has arisen due to the generated voltage at both ends of the resistance forming the low-pass filter during the disconnection test.

For ease of explanation, the VBAT1 to VBAT4, the voltage of the secondary cells BAT1 to BAT4, the resistances Rs11 to Rs42, and the resistances Rf1 to Rf4 are assumed to satisfy condition expressions below (cond1 to cond5).

$$VBAT1 = VBAT2 = VBAT3 = VBAT4 \quad \text{(cond1)}$$

$$Rs11+Rs12=Rs21+Rs22=Rs31+Rs32=Rs41+Rs42 \quad \text{(cond2)}$$

$$Rf1 = Rf2 = Rf3 = Rf4 \quad \text{(cond3)}$$

$$Rs11+Rs12 \gg Rf1 \quad \text{(cond4)}$$

$$Rs11+Rs12 \gg R11 \quad \text{(cond5)}$$

Hereinafter, the state in which the disconnection test interval twait shown in FIG. 2 elapses, the control signal VG1 turns to "L" and the PMOS transistor M1 turns ON will be described. At that time, a current I1 between the cell-connecting terminals VC1 and VC2 satisfies an expression below (1-1) since the resistance R11 is connected in parallel to the resistance Rs11 and Rs12.

$$I1 = \frac{VBAT1}{\frac{(Rs11+Rs12) \times R11}{Rs11+Rs12+R11} + Rf1 + Rf2} \quad (1\text{-}1)$$

Now, substituting the condition expression (cond3) and the condition expression (cond4) into the expression (1-1), the current I1 is expressed as in the expression below (1-2), $$I1 \approx \frac{VBAT1}{Rs11+Rs12} + \frac{VBAT1}{R11} \quad (1\text{-}2)$$

And, a current I2 between the cell-connecting terminals VC2 and VC3 is expressed as in the expression below (1-3) since the resistances Rs21 and Rs22 are connected in series.

$$I2 = \frac{VBAT2}{Rs21+Rs22+Rf2+Rf3} \quad (1\text{-}3)$$

In the same way as the expression (1-1), substituting the condition expression (cond3) and the condition expression (cond4) into the expression (1-3), the current I2 is expressed as in the expression below (1-4).

$$I2 \approx \frac{VBAT2}{Rs21+Rs22} \quad (1\text{-}4)$$

Further, substituting the condition expression (cond1) and the condition expression (cond2) into the expression (1-4), it is expressed as in the expression below (1-5).

$$I2 \approx \frac{VBAT1}{Rs11+Rs12} \quad (1\text{-}5)$$

By the expression (1-2) and the expression (1-5), it is found that the current I1 between the cell-connecting terminals VC1 and VC2 is greater than the current I2 between the cell-connecting terminals VC2 and VC3, and the difference is expressed as in the expression below (1-6).

$$I3 = I1 - I2 = \frac{VBAT1}{R11} \quad (1\text{-}6)$$

The current calculated by the expression (1-6) drains into the secondary cells through the cell-connecting terminal VC2 and the resistance Rf2 forming the low-pass filter. As a result, the voltages are generated in both ends of the resistance Rf2, and the voltage Vvc2 between the cell-connecting terminals VC2 and VC3 becomes higher than the voltage VBAT2 of the secondary cell BAT2. At that time, the voltage Vvc2 between the cell-connecting terminals VC2 and VC3 is expressed as in the expression below (1-7).

$$Vvc2 \approx VBAT2 + \frac{VBAT1}{R11} \times Rf2 \quad (1\text{-}7)$$

If the voltage VBAT2 of the secondary cell BAT2 satisfies the expressions below (1-9) and (1-10) to the high-voltage detecting level VHsens calculated by the expression below (1-8), output from the comparator 12 inverts and output from a malfunction-detecting circuit 20 VHS outputs "H". At that time, because the disconnection test signal LTEST is "H", the judging circuit 120 judges the connection between the secondary cells and the protective semiconductor device 1 is disconnected and outputs "H" expressing the disconnection-detecting mode.

$$VHsens = \frac{Rs21+Rs22}{Rs22} \times Vr21 \quad (1\text{-}8)$$

$$VBAT2 + \frac{VBAT1}{R11} \times Rf2 > VHsens \quad (1\text{-}9)$$

$$VHsens > VBAT2 \quad (1\text{-}10)$$

That is to say, the disconnection between the protective semiconductor device and the secondary cells can be detected even though no disconnection has arisen depending on the voltage of the secondary cells due to the generated voltage at both ends of the resistance forming a low-pass filter during the disconnection test. Note that, if the voltage VBAT2 of the secondary cell BAT2 satisfies the expression below (1-11), neither the disconnection nor the high-voltage is detected, and if the voltage VBAT2 satisfies the expression below (1-12), the high-voltage is detected.

$$VBAT2 + \frac{VBAT1}{R11} \times Rf2 < VHsens \quad (1\text{-}11)$$

$$VHsens < VBAT2 \quad (1\text{-}12)$$

The aim of the second embodiment of the invention is to solve the problem that the disconnection between the protective semiconductor device and the secondary cells can be detected even though no disconnection has arisen depending on the voltage of the secondary cells due to the generated voltage at both ends of the resistance forming a low-pass filter during the disconnection test.

2.2 Configuration of the Protective Semiconductor Device

Figure 5:
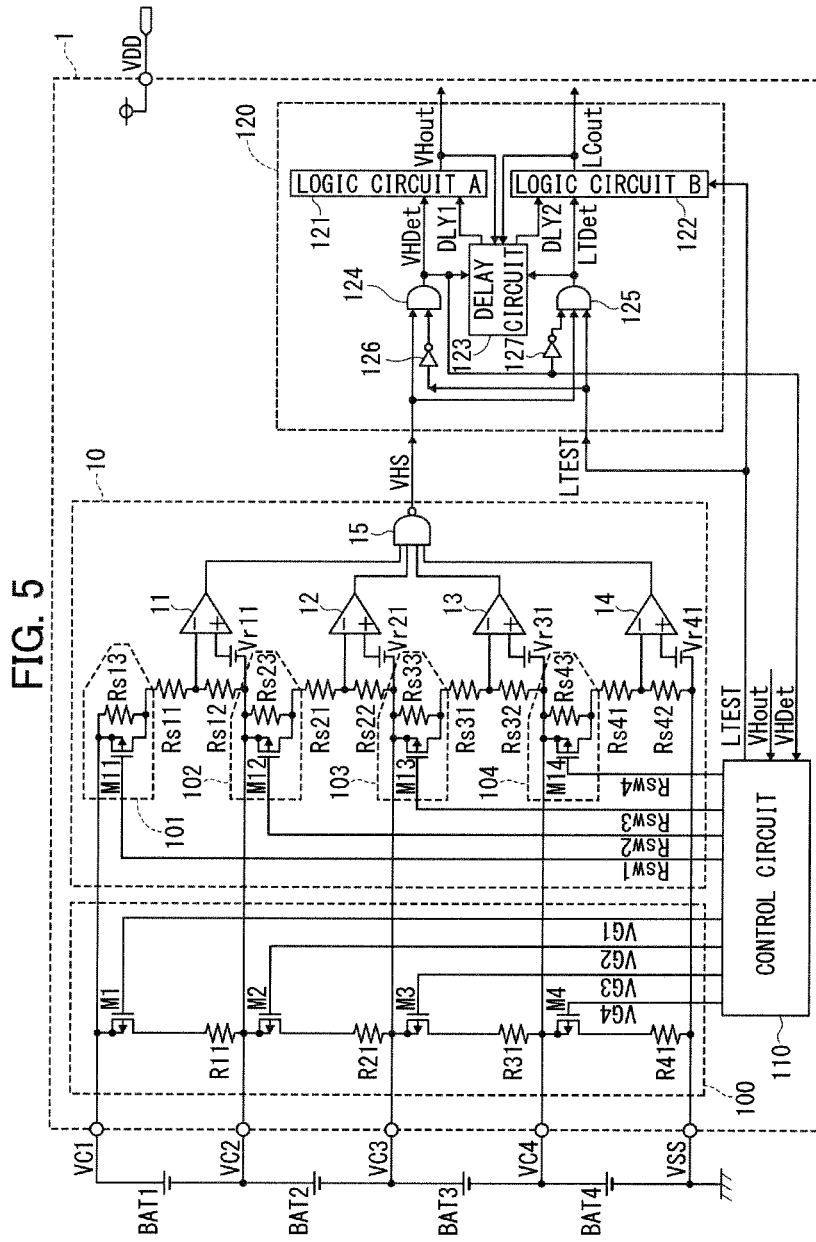
FIG. 5 is a schematic diagram of the protective semiconductor device according to the second embodiment of the invention and the secondary cells.

FIG. 5 is a schematic diagram of the protective semiconductor device 1 according to the second embodiment of the invention and the secondary cells. The protective semiconductor device according to the second embodiment has the configuration substantially similar to the protective semiconductor device according to the first embodiment of the invention. Therefore, the differences between them will be primarily described.

The malfunction-detecting circuit 10 of the protective semiconductor device 1 according to the second embodiment of the invention includes, the comparators 11,12,13,14, the reference voltage Vr11, Vr21, Vr31, Vr41, the partial resistances Rs11, Rs12, Rs21, Rs22, Rs31, Rs32, Rs41, Rs42, the NAND circuit 15, and sense-voltage-changing circuits 101, 102,103,104. Of them, the comparator 11, the resistances Rs11, Rs12, the reference voltage Vr11 and the sense voltage-changing circuit 101 configure the circuit to detect the high-voltage and the disconnection of the first secondary cell BAT1. The resistances Rs11, Rs12 and the sense voltage-changing circuit 101 are connected in series and further connected between the cell-connecting terminals VC1 and VC2. A connection node of the resistances Rs11, Rs12 is connected to the inverting input of the comparator 11. The reference voltage Vr11 is connected between the non-inverting input of the comparator 11 and the cell-connecting terminal VC2. Note that, the resistances Rs11 and Rs12 form the voltage-sense resistance to the first secondary cell BAT1.

The sense voltage-changing circuit 101 is composed of a parallel connection of the PMOS transistor M1 and the resistance Rs13. The gate of the PMOS transistor M11 is connected to a control signal Rsw1 from the control circuit 110. The sense voltage-changing circuit 101 is a circuit connecting the resistance Rs13 in series to the resistances Rs11 and Rs12 which are the voltage-sense resistance in order to change the inverted voltage of the comparator during the operation of the disconnection test.

The malfunction-detecting circuits of the second secondary cell BAT2 to the fourth secondary cell BAT4 have the same configurations as the configuration of the first secondary cell BAT1.

The control circuit 110 is inputted the high-voltage detecting-operation signal VHDet and the high-voltage detecting signal VHout, while outputting the control signals VG1, VG2, VG3, VG4 to the PMOS transistors M1 to M4 of the internal-resistance-changing circuit 100, and the disconnection test signal LTEST to a logic circuit B 122. Further, the control circuit 110 outputs the control signals Rsw1, Rsw2, Rsw3, Rsw4 to the gates of the PMOS transistors M11 to M14 of the sense-voltage-changing circuits 101 to 104. Moreover, the clock, the external trigger, and so on not shown in drawings are inputted to the control circuit 110 in order to produce the control signals VG1 to VG4, the disconnection test signal LTEST, and the control signals Rsw1, Rsw2, Rsw3, Rsw4.

2.3. Control Signal of the Control Circuit

Figure 6:
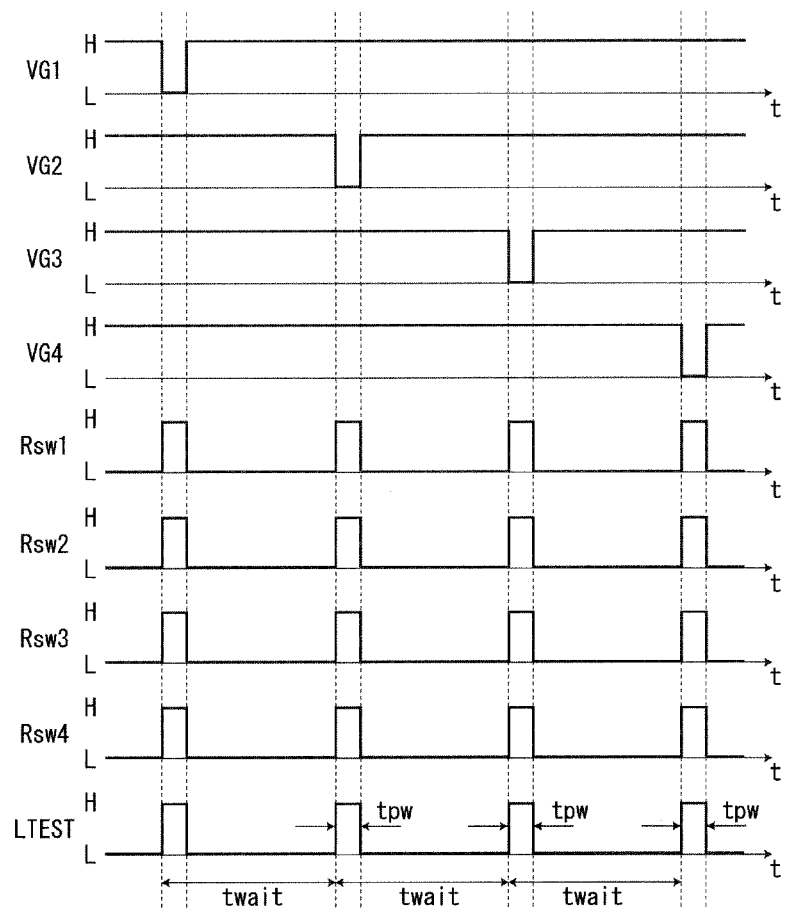
FIG. 6 is a diagram illustrating an example of the control signal of the control circuit in the protective semiconductor device according to the second embodiment of the invention.

FIG. 6 is a diagram illustrating an example of the control signal of the control circuit 110 in the protective semiconductor device according to the second embodiment. First, the operation of the control circuit 110 will be described as background information in order to describe the operation of the protective semiconductor device. The control circuit 110 produces the control signals VG1 to VG4, Rsw1 to Rsw4, and the disconnection test signal LTEST from the entered clock and so on in order to perform the connection test between the secondary cells and the protective semiconductor device at the constant time interval twait.

As shown in FIG. 6, the control circuit 110 causes output from the disconnection test signal LTEST informing the judging circuit 120 that the disconnection test is being performed to turn to "H" during the time period width tpw at the constant time interval twait.

In regard to the control signals VG1 to VG4, one of them turns to "L" in tandem with the disconnection test signal LTEST and turns ON the PMOS transistors M1 to M4 connected to each of the signals, and causes the resistances R11 to 41 to be connected in parallel to the voltage-sense resistance depending on these PMOS transistors M1 to M4 turned ON.

In regard to the control signals Rsw1 to Rsw4, all of them turn to "H" in tandem with the disconnection test signal LTEST and turn OFF the PMOS transistors M11 to M14 connected thereto respectively, and this causes the resistances Rs13, Rs23, Rs33, Rs43 to be connected in series to the voltage-sense resistance depending on the PMOS transistors being turned OFF.

The disconnection test interval twait and the disconnection-testing time period tpw can be any period, but the disconnection-testing time period tpw should be shorter than the delay time produced by the delay circuit 123.

2.4. Operation of the Protective Semiconductor Device

Figure 7:
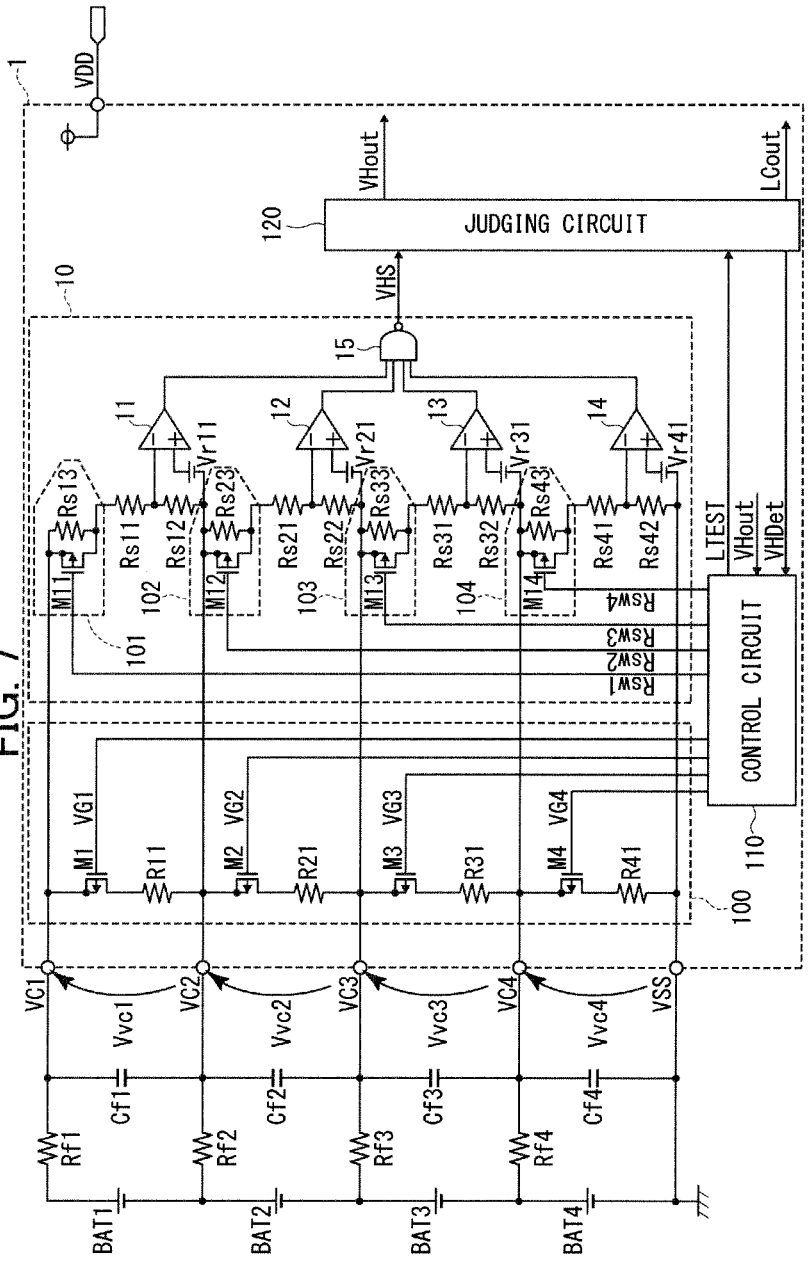
FIG. 7 illustrates a practical schematic diagram of the protective semiconductor device according to the second embodiment of the invention and the secondary cells.

FIG. 7 illustrates a practical schematic diagram of the protective semiconductor device according to the second embodiment of the invention and the secondary cells. The protective semiconductor device 1 shown in FIG. 7 is also connected through the low-pass filter composed of the resistances Rf1 to Rf4 and the capacitances Cf1 to Cf4 as a measure against noise, as shown schematically in FIG. 4.

In the second embodiment, the resistances Rs13, Rs23, Rs33, and Rs43 are connected in series to each voltage-sense resistance of the malfunction-detecting circuit 10 by the sense-voltage-changing circuits 101 to 104 only during the detection of disconnection. This raises the inversion level of the comparator by setting the high-voltage detecting level VHsens, which is higher than the disconnection detecting level LTsens, and solves the problem which arises when the second embodiment is not applied (see FIG. 4).

The operation of the protective semiconductor device according to the second embodiment will be described with reference to FIG. 7. For ease of explanation, VBAT1 to VBAT4, which are the voltages of the secondary cells BAT1 to BAT4, the resistances Rs11 to Rs43, and the resistances Rf1 to Rf4 are assumed to satisfy condition expressions below (cond6 to cond11).

$$VBAT1 = VBAT2 = VBAT3 = VBAT4 \quad \text{(cond6)}$$

$$Rs11 + Rs12 = Rs21 + Rs22 = Rs31 + Rs32 = Rs41 + Rs42 \quad \text{(cond7)}$$

$$Rf1 = Rf2 = Rf3 = Rf4 \quad \text{(cond8)}$$

$$Rs11 + Rs12 \gg Rf1 \quad \text{(cond9)}$$

$$Rs11 + Rs12 \gg R11 \quad \text{(cond10)}$$

$$Rs13 = Rs23 = Rs33 = Rs43 \quad \text{(cond11)}$$

Hereinafter, the state in which the disconnection test interval twait shown in FIG. 6 elapses, the control signal VG1 turns to "L" and the PMOS transistor M1 turns ON, and at the same time, the control signals Vsw1 to Vsw4 turns to "H" and the PMOS transistor M11 to M14 turns OFF, will be described. At that time, the current I1 between the cell-connecting terminals VC1 and VC2 satisfies the expression below (2-1) since the resistances Rs11 and Rs12 are connected to the resistance R13 in series, and connected to the resistance R11 in parallel.

$$I1 = \frac{VBAT1}{\frac{(Rs11 + Rs12) \times R11}{Rs11 + Rs12 + R11} + Rf1 + Rf2} \quad (2\text{-}1)$$

Now, substituting the condition expression (cond8) and the condition expression (cond9) into the expression (2-1), the current I1 is expressed as in the expression below (2-2).

$$I1 \approx \frac{VBAT1}{Rs11 + Rs12} + \frac{VBAT1}{R11} \quad (2\text{-}2)$$

And, the current I2 between the cell-connecting terminals VC2 and VC3 is expressed as in the expression below (2-3) since the resistance Rs23 is connected in series to the resistances Rs21 and Rs22.

$$I2 = \frac{VBAT2}{Rs21 + Rs22 + Rs23 + Rf2 + Rf3} \quad (2\text{-}3)$$

In the same way as the expression (2-1), substituting the condition expression (cond8) and the condition expression (cond9) into the expression (2-3), the current I2 is expressed as in the expression below (2-4).

$$I2 \approx \frac{VBAT2}{Rs21 + Rs22 + Rs23} \quad (2\text{-}4)$$

Further, substituting the condition expression (cond6) and the condition expression (cond7) into the expression (2-4), it is expressed as in the expression below (2-5).

$$I2 \approx \frac{VBAT1}{Rs11 + Rs12} \quad (2\text{-}5)$$

By the expression (2-2) and the expression (2-5), it is found that the current I1 between the cell-connecting terminals VC1 and VC2 is greater than the current I2 between the cell-connecting terminals VC2 and VC3, and the difference is expressed as in the expression below (2-6).

$$I3 = I1 - I2 = \frac{VBAT1}{R11} \quad (2\text{-}6)$$

The current calculated by the expression (2-6) is drain into the secondary cells through the cell-connecting terminal VC2 and the resistance Rf2 forming the low-pass filter. As a result, the voltages are generated in both ends of the resistance Rf2, and the voltage Vvc2 between the cell-connecting terminals VC2 and VC3 becomes higher than the voltage VBAT2 of the secondary cell BAT2. At that time, the voltage Vvc2 between the cell-connecting terminals VC2 and VC3 is expressed as in the expression below (2-7).

$$Vvc2 \approx VBAT2 + \frac{VBAT1}{R11} \times Rf2 \quad (2\text{-}7)$$

The description made thus far is substantially the same as the description of FIG. 4. However, the inversion level of the comparator is not the high-voltage detecting level VHsens calculated by the expression below (1-8) but the disconnection detecting level LTsens calculated by the expression below (2-8).

$$LTsens = \frac{Rs21 + Rs22}{Rs22} \times Vr21 + \frac{Rs23}{Rs22} \times Vr21 \quad (2\text{-}8)$$

If the resistance Rs23 set up to satisfy the expression below (2-9), the false detection of the disconnection illustrated with reference to FIG. 4 is prevented since the VBAT2, the voltage of the secondary cell BAT2, does not satisfy the expression below (2-10) which is the condition for the output inversion of the comparator 12, even if the VBAT2 satisfies the expression (1-9) and the expression (1-10).

$$\frac{Rs23}{Rs22} \times Vr21 > \frac{VBAT1}{R11} \times Rf2 \quad (2\text{-}9)$$

$$VBAT2 + \frac{VBAT1}{R11} \times Rf2 > LTsens \quad (2\text{-}10)$$

If the disconnection between the cell-connecting terminal VC2 and the secondary cells has arisen, the voltage Vvc2 between the cell-connecting terminals VC2 and VC3 is a value of the voltage which can be calculated by the expression below (2-11) after considering the condition expression (cond9).

$$Vvc2 = \frac{Rs21 + Rs22 + Rs23}{\frac{R11 \times (Rs11 + Rs12 + Rs13)}{R11 + Rs11 + Rs12 + Rs13} + Rs21 + Rs22 + Rs23} \times \quad (2\text{-}11)$$

$$(VBAT1 + VBAT2)$$

Next, substituting the condition expression (cond7) and the condition expression (cond10) into the expression (2-11), and the expression below (2-12) is obtained.

$$Vvc2 \approx \frac{(Rs21 + Rs22 + Rs23)}{R11 + (Rs21 + Rs22 + Rs23)} \times (VBAT1 + VBAT2) \quad (2\text{-}12)$$

That is to say, detection of the disconnection is possible without any difficulty, even if a judgment condition of the comparator during disconnection detecting is changed to the disconnection detecting level LTsens higher than the high-voltage detecting level VHsens.

Figure 8:
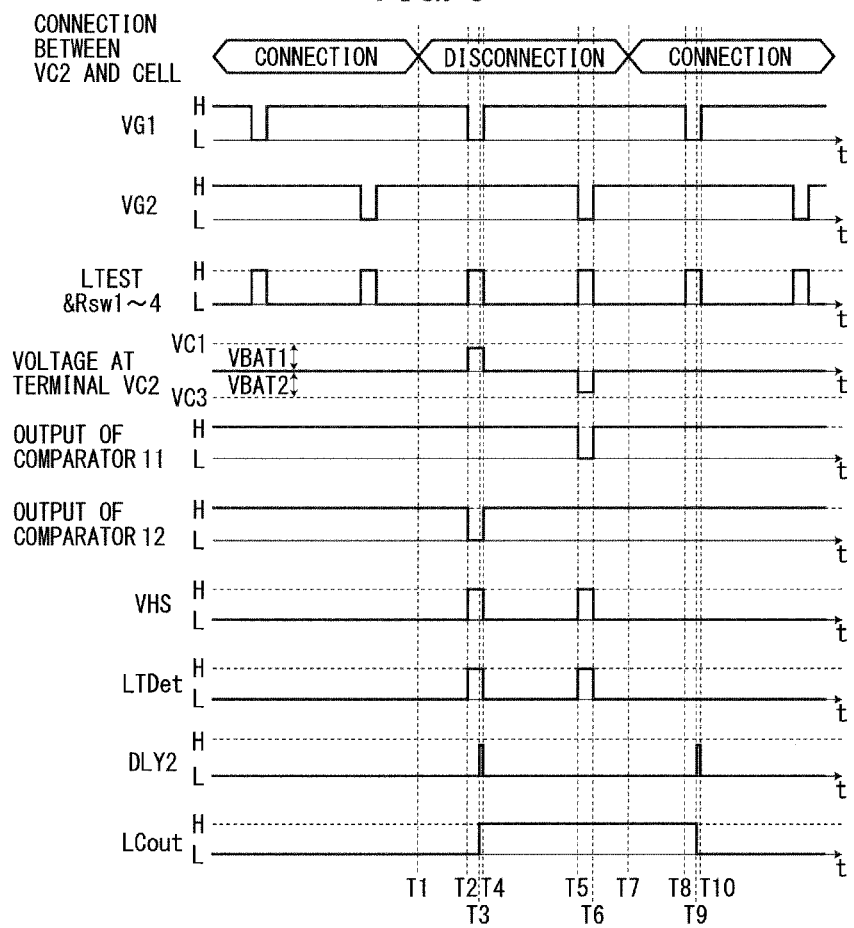
FIG. 8 is an operation timing diagram of the protective semiconductor device according to the second embodiment of the invention operating the detection of disconnection.

2.5. Operation of the Protective Semiconductor Device at the Time of the Detection of Disconnection The disconnection detecting operation of the protective semiconductor device according to the second embodiment of the invention will be described hereinafter with reference to FIG. 8 and FIG. 5. FIG. 8 is the operation timing diagram of the protective semiconductor device according to the second embodiment at the time of the detection of disconnection. In the timing diagram, only signals necessary for the description are shown. For ease of explanation, the values of the VBAT1 to VBAT4, the voltage of the secondary cells BAT1 to BAT4 and the resistance value of the resistances Rs11 to Rs43 are assumed to satisfy the condition expressions below (cond31 to cond33).

$$VBAT1 = VBAT2 = VBAT3 = VBAT4 \quad (\text{cond31})$$

$$Rs11 + Rs12 = Rs21 + Rs22 = Rs31 + Rs32 = Rs41 + Rs42 \quad (\text{cond32})$$

$$Rs13 = Rs23 = Rs33 = Rs43 \quad (\text{cond33})$$

In the timing diagram shown in FIG. 8, an example is illustrated that the protective semiconductor device and the secondary cells are "connected" at first, next "disconnected", and "connected" again at the end. Hereinafter, the performance will be described in the chronological order.

[Time T1:] It is assumed that the secondary cells and the cell-connecting terminal VC2 are disconnected. At that time, the voltage between the cell-connecting terminals VC2 and VC3 is obtained by the partial resistances Rs11 to Rs22, and led to a voltage V2A calculated according to the expression below (3-1).

$$V2A = \frac{Rs21 + Rs22}{Rs11 + Rs12 + Rs21 + Rs22} \times (VBAT1 + VBAT2) \quad (3\text{-}1)$$

By reference to the condition expressions (cond31 to cond33), it is found that the voltage V2A between the cell-connecting terminals VC2 and VC3 is unchanged from the voltage VBAT2 before the disconnection. Therefore, any of output from the comparators 11 to 14 is stationary.

[Time T2:] The disconnection test signal LTEST, output from the control circuit 110, is turned from output "L" to output "H", and informs to the judging circuit 120 that the disconnection test is being performed. At the same time, the control signal VG1 turns from "H" to "L" and the PMOS transistor M1 turns ON. Further, output from the control signals Rsw1 to Rsw4 turns from "L" to "H" and all of the PMOS transistors M11 to M14 have turned OFF. Therefore, the resistance Rs13 is connected in series to the resistances Rs11 and Rs12, and the resistance R11 is connected in parallel. The voltage between the cell-connecting terminals VC2 and VC3 is a voltage V2B calculated according to the expression below (3-2) since the resistance Rs23 is connected in series to the resistances Rs21 and Rs22.

$$V2B = \frac{Rs21 + Rs22 + Rs23}{\frac{R11 \times (Rs11 + Rs12 + Rs13)}{R11 + Rs11 + Rs12 + Rs13} + Rs21 + Rs22 + Rs23} \times (VBAT1 + VBAT2) \quad (3\text{-}2)$$

The voltage between the cell-connecting terminals VC2 and VC3 is substantially equal to a voltage V2C calculated according to the expression below (3-3) if the resistance R11 is sufficiently small compared to a sum of the resistances Rs11, Rs12 and Rs13.

$$V2C \approx \frac{Rs21 + Rs22 + Rs23}{R11 + Rs21 + Rs22 + Rs23} \times (VBAT1 + VBAT2) \quad (3\text{-}3)$$

It is found by the expressions (3-2) and (3-3), that the voltage of the cell-connecting terminal VC2 is pulled up in closer to the voltage of the cell-connecting terminal VC1 which is a positive terminal of the secondary cell BAT1. That is to say, the voltage between the cell-connecting terminals VC2 and VC3 increase, accordingly, the output from the comparator 12 turns "L" expressing the detecting state. As a result, the detection signal VHS, which is output from the malfunction-detecting circuit 10, turns from "L" to "H".

The AND circuit 124 in the judging circuit 120 leave the high-voltage detecting-operation signal VHDet "L" (i.e., the detection of high-voltage is not performed at this time) even if the detection signal VHS turns from "L" to "H", since the disconnection test is being performed (i.e., output from the disconnection test signal LTEST is "H"). That is to say, the control circuit 110 leave the disconnection test signal LTEST "L". Since the disconnection test is on the process, the other AND circuit 125 in the judging circuit 120 turns the disconnection detecting-operation signal LTDet from "L" to "H" in tandem with the detection signal VHS turning from "L" to "H".

[Time T3:] The delay circuit 123 in the judging circuit 120 outputs the H-pulse to the delayed output DLY2 since the detection signal VHS has remained "H" until the end of the predetermined period. By outputting of the H-pulse from the delayed output DLY2 of the delay circuit 123 while the disconnection test signal LTEST is "H" and also the detection signal VHS which is output from the malfunction-detecting circuit 10 is "H", the logic circuit B 122 judges that the disconnection has arisen and turns the disconnection-detecting signal LCout to "H" expressing the disconnection-detecting state.

[Time T4:] The disconnection test signal LTEST turns to "L", the control signal VG1 turns from the output "L" to "H", hence the PMOS transistor M1 returns to OFF-state, and the control signals Rsw1 to Rsw4 turn from the output "H" to "L", hence the PMOS transistors M11 to M14 return to ON-state. The voltage between the cell-connecting terminals VC2 and VC3 return to the voltage V2A calculated according to the expression above (3-1). Therefore, the detection signal VHS, output from the malfunction-detecting circuit 10, turns (returns) from "H" to "L", but the disconnection-detecting signal LCout, output from the logic circuit B 122, remains as "H" and does not vary since the disconnection test signal LTEST is "L".

[Time T5:] The disconnection test signal LTEST, output from the control circuit 110, is turned from output "L" to output "H", and informs to the judging circuit 120 that the disconnection test is being performed. At the same time, output from the control signal VG2 turns from "H" to "L", hence the PMOS transistor M2 is turned ON. Moreover, output from the control signals Rsw1 to Rsw4 turns from "L" to "H" and all of the PMOS transistors M11 to M14 are turned OFF.

Therefore, the resistance Rs13 is connected in series to the resistances Rs11 and Rs12. The voltage between the cell-connecting terminals VC2 and VC3 is a voltage V2D calculated according to the expression below (3-4) since the resistance Rs23 is connected in series to the resistances Rs21 and Rs22, and the resistance R21 is connected in parallel.

$$V2D = \frac{\frac{R21 \times (Rs21 + Rs22 + Rs23)}{R21 + Rs21 + Rs22 + Rs23}}{Rs11 + Rs12 + Rs13 + \frac{R21 \times (Rs21 + Rs22 + Rs23)}{R21 + Rs21 + Rs22 + Rs23}} \times (VBAT1 + VBAT2) \quad (3\text{-}4)$$

The voltage between the cell-connecting terminals VC2 and VC3 is substantially equal to a voltage V2E calculated according to the expression below (3-5) if the resistance R21 is sufficiently small compared to the sum of the resistances Rs21, Rs22 and Rs23.

$$V2E \approx \frac{R21}{Rs11 + Rs12 + Rs13 + Rs21} \times (VBAT1 + VBAT2) \quad (3\text{-}5)$$

It is found by the expressions (3-4) and (3-5) that the voltage of the cell-connecting terminal VC2 is pulled down closer to the voltage of the cell-connecting terminal VC3 which is the positive terminal of the secondary cell BAT2. That is to say, while the voltage between the cell-connecting terminals VC2 and VC3 decreases, the voltage V1A between the cell-connecting terminals VC1 and VC2 increases expressed by the expression below (3-6). Accordingly, the comparator 11 detects the high-voltage and whose output turns to "L" expressing the high-voltage detecting state. As a result, the detection signal VHS which is output from the malfunction-detecting circuit 10 turned from "L" to "H".

$$V1A = VBAT1 + VBAT2 - V2E \quad (3\text{-}6)$$

Then, when the disconnection test is operated (i.e., when the disconnection test signal LTEST is "H"), the detection signal VHS, output from the malfunction-detecting circuit 10, turns from "L" to "H", but the disconnection-detecting signal LCout, output from the logic circuit B 122 is already "H" and does not vary.

[Time T6:] In the same way as the time T4, the disconnection test signal LTEST turns to "L", output from the control signal VG2 turns from "L" to "H", and hence the PMOS transistor M1 return to OFF-state, and output from the control signals Rsw1 to Rsw4 turns from "H" to "L", hence the PMOS transistors M11 to M14 return to ON-state. The voltage between the cell-connecting terminals VC2 and VC3 returns to the voltage V2A calculated according to the expression above (3-1). Therefore, the detection signal VHS, output from the malfunction-detecting circuit 10, turns (returns) from "H" to "L", but the disconnection-detecting signal LCout, output from the logic circuit B 122, remains as "H" and does not vary since the disconnection test signal LTEST is "L".

[Time T7:] Now, it is assumed that the disconnected spot is fixed.

[Time T8:] The disconnection test signal LTEST, output from the control circuit 110, turns from "L" to "H", and informs the logic circuit B 122 that the disconnection test is being performed. At the same time, the control signal VG1 turns from "H" to "L" hence the PMOS transistor M1 turns ON. Moreover, output from the control signals Rsw1 to Rsw4 turns from "L" to "H" and all of the PMOS transistors M11 to M14 are turned OFF. Therefore, the resistance Rs13 is connected in series to the resistances Rs11 and Rs12, and the resistance R11 is connected in parallel. Further, the resistance Rs23 is connected in series to the resistances Rs21 and Rs22. However, unlike in the time T2 to T3, or time T4 to T5, the voltage between the cell-connecting terminals VC2 and VC3 does not vary from VBAT2 since the cell-connecting terminal VC2 is connected to the secondary cells. Therefore, the output from the malfunction-detecting circuit VHS is stationary.

[Time T9:] The delay circuit 123 in the judging circuit 120 outputs the H-pulse to the delayed output DLY2 when the detection signal VHS has remained "L" until the end of the predetermined period. The H-pulse is outputted from the delayed output DLY2 of the delay circuit 123 during the disconnection test signal LTEST is "H" and the detection signal VHS which is output from the malfunction-detecting circuit 10 is "L". Hence, the logic circuit B 122 judges that the protective semiconductor device has returned from the disconnection and turns the disconnection-detecting signal LCout to "L" expressing the returning from disconnection state.

[Time T10:] The disconnection test signal LTEST which is output from the control circuit 210 turns from "H" to "L", and informs the logic circuit B 122 that the disconnection test is over. In the same time, output from the control signal VG1 turns from "L" to "H", hence the PMOS transistor M1 returns to OFF-state, and output from the control signals Rsw1 to Rsw4 turns from "H" to "L", hence the PMOS transistors M11 to M14 return to ON-state. The same as in the time T8, the voltage between the cell-connecting terminals VC2 and VC3 does not vary since the cell-connecting terminal VC3 is connected to the secondary cells.

This is the example of the operation of the protective semiconductor device when the disconnection between the secondary cells and the cell-connecting terminal VC2 arise. Regarding to the disconnection of another cell-connecting terminal (e.g., VC3 or VC4) and the secondary cells, the operation is the same as the above example in principle and descriptions thereof are omitted.

2.6. Summary of the Second Embodiment

As stated above, in the second embodiment, in the protective semiconductor device for the secondary cells wherein the comparator detecting the fluctuation in voltage is installed to the each secondary cell which are connected in series, the other resistance is sequentially and temporarily connected to the resistances forming the comparators for the each secondary cell, and at that time, the comparator detects the fluctuation in voltage at the each terminal between the secondary cells and the protective semiconductor device. When connecting the resistance stated above in parallel, while the other resistances are connected to the each resistance in series to the resistances forming the comparators for all of the respective secondary cells, hence the inversion level of the comparator get higher. In this way, the problem with the false detection of the disconnection between the secondary cells and the cell-connecting terminal is prevented even if the protective semiconductor device is connected through the low-pass filter as the measure against noise.

Third Embodiment

The protective semiconductor device according to the second embodiment of the invention sometimes does not function normally the operation of the detection of disconnection, if the circuit including the resistance having a lower value is connected to the each secondary cell in parallel in order to even out the voltage of the plurality of the secondary cells. Therefore, the protective semiconductor device according to the third embodiment of the invention enables to function normally the operation of the detection of disconnection by disabling the resistance having the lower value when detecting the disconnection.

3.1 Configuration of the Protective Semiconductor Device

Figure 9:
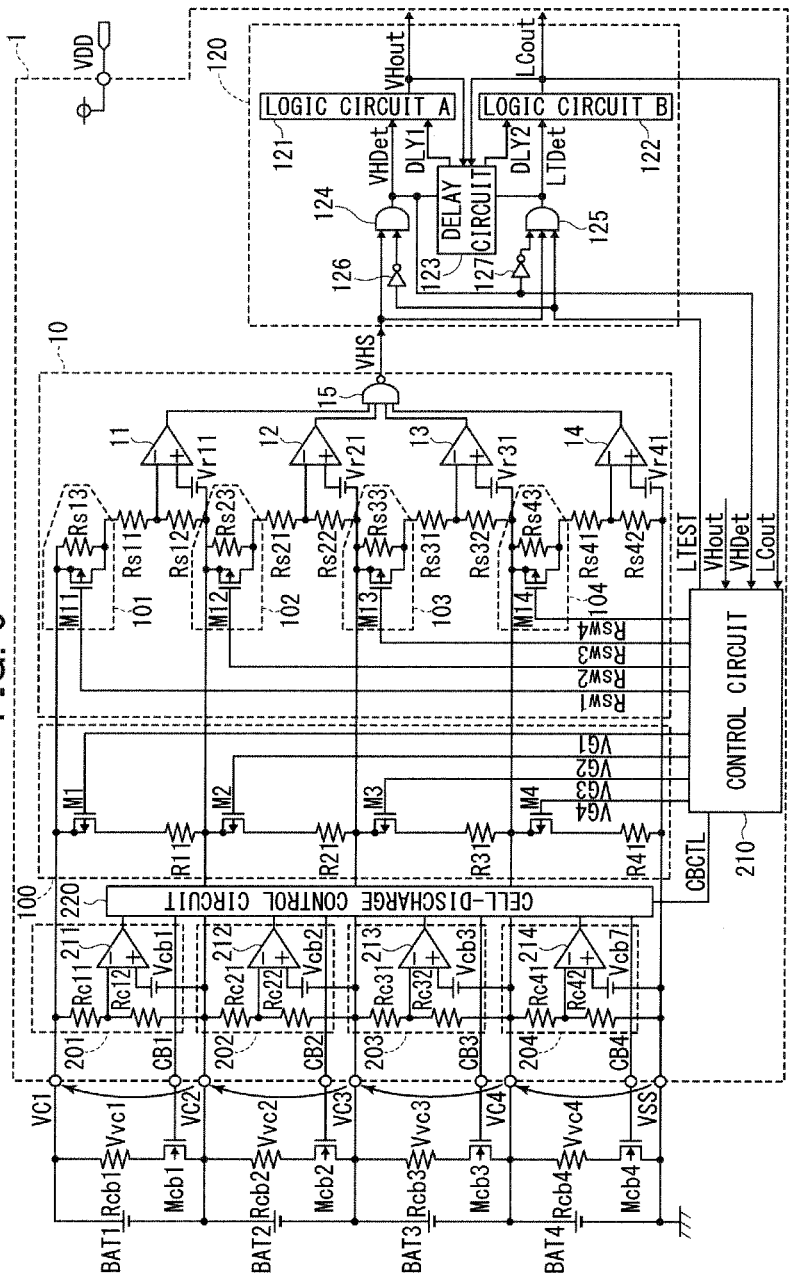
FIG. 9 is a schematic diagram of the protective semiconductor device according to the third embodiment of the invention and the secondary cells.
Figure 10:
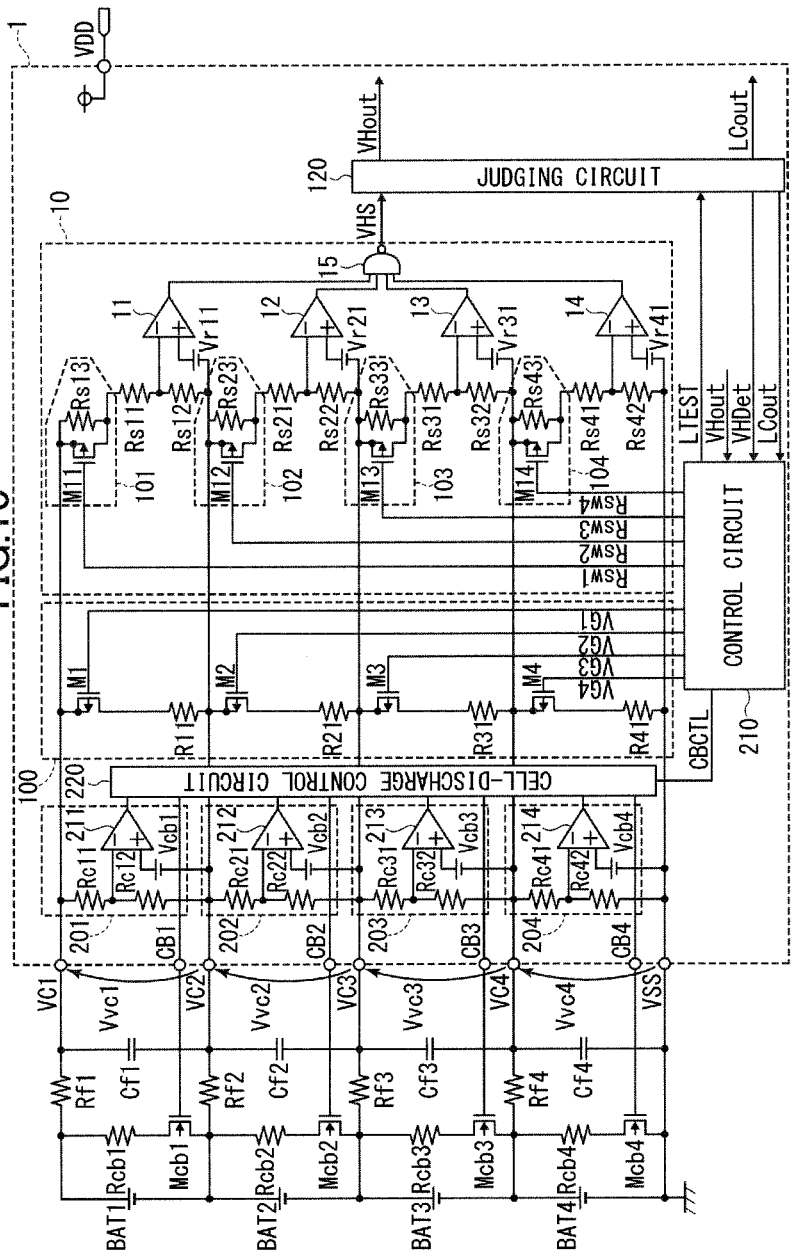
FIG. 10 is a practical schematic diagram of the protective semiconductor device according to the third embodiment of the invention and the secondary cells.

FIG. 9 is the schematic diagram of the protective semiconductor device 1 according to the third embodiment and the secondary cells. FIG. 10 is the practical schematic diagram of the protective semiconductor device according to the third embodiment and the secondary cells. The protective semiconductor device 1 shown in FIG. 10 is also connected through the low-pass filter (formed by the resistance Rf1 to Rf4 and the capacitance Cf1 to Cf4) as the measure against noise, as the schematic diagram shown in FIG. 7.

The protective semiconductor device 1 according to the third embodiment has basically same configuration to the protective semiconductor device 1 according to the second embodiment shown in FIG. 5. Therefore, the differences between them will be primarily described with reference to FIG. 9, FIG. 10, and FIG. 5.

The protective semiconductor device according to the second embodiment sometime does not function normally the operation of the detention of disconnection if an additional function which is achieved by connecting such as the resistance having the lower value to the each secondary cell is added. The protective semiconductor device according to the third embodiment is configured so that the detection of disconnection is functioned normally while solving this problem.

First, an example of the additional function which is achieved by connecting such as the resistance having the lower value to the each secondary cell will be described. In the circuit shown in FIG. 9 and FIG. 10, external resistances Rcb1 to Rcb4, external NMOS transistors Mcb1 to Mcb4 and terminals CB1 to CB4 outputting control signals to control the on/off of the external NMOS transistors Mcb1 to Mcb4 are added to the circuit shown in FIG. 5. Further, voltage-detecting circuits 201 to 204 and the cell-discharge control circuit 220 are added as the circuits to control the on/off of the external NMOS transistors Mcb1 to Mcb4 in the protective semiconductor device 1. The control circuit 110 shown in FIG. 5 is replaced by a control circuit 210 additionally controlling the cell-discharge control circuit 220 by a control signal CBCTL in the circuit shown in FIG. 9 and FIG. 10. The external resistances Rcb1 to Rcb4, the external NMOS transistors Mcb1 to Mcb4, the terminals CB1 to CB4, the voltage-detecting circuits 201 to 204 and the cell-discharge control circuit 220 are the circuits to achieve the additional function mentioned above.

The circuits to achieve the additional function mentioned above perform a function to even out the voltage of the plurality of the secondary cells. First, the voltage-detecting circuits 201 to 204 are the voltage-detecting circuits setting the voltage level to trigger the external NMOS transistors Mcb1 to Mcb4. For example, output from the voltage-detecting circuit 201 is "L" when the voltage of the secondary cell BAT1 exceeds 4.0V. Then, the signal is transmitted to the cell-discharge control circuit 220. The cell-discharge control circuit 220 is the control circuit outputting to the terminals CB1 to CB4 depending on the state of the protective semiconductor device 1 in response to the output from the voltage-detecting circuits 201 to 204. For example, when output from the voltage-detecting circuits 201 is "L", the signal "H" is outputted to the terminal CB1 if the cell-discharge control circuit 220 judges that it is possible to output "H" to the terminal CB1 depending on the state of the protective semiconductor device 1. As a result, the signal "H" is inputted to the NMOS transistor Mcb1, hence the resistance Rcb1 having lower value shunts the positive and negative terminals of the secondary cell BAT1. By applying the current to a path including the resistance Rcb1, the secondary cells discharge the excess amount of charge beyond 4.0V if the voltage of the each secondary cell exceeds 4.0V. By discharging until the voltage of all the secondary cells reach 4.0V, the voltage of the plurality of secondary cells are evened out.

As stated above, the circuits to achieve the additional function perform the function to even out the voltage of the plurality of secondary cells. The circuits to achieve this function are configured in low-value resistance relatively. As these resistances Rcb1 to Rcb4, resistances which are equivalent to or lower than the resistances R11 to R 41 are often used. Therefore, the operation of the detection of disconnecting is not functioned normally if the detection of disconnecting is performed with the resistances Rcb1 to Rcb4 are connected since a large amount of current applied to the path including the resistances Rcb1 to Rcb4. Likewise, the detecting of the disconnection also does not function normally if the voltage-detecting circuits 201 to 204 output "L" with detection of the disconnection, and in response to this, the cell-discharge control circuit 220 makes the resistances Rcb1 to Rcb4 to be connected by turning ON the NMOS transistors Mcb1 to Mcb4.

The control circuit 210 outputs "L" to the control signal CBCTL from just before the operation of the detection of disconnection starts. The control circuit 210 transmits to the control circuit 220 that the detection of disconnection is starting in order not to turn ON the external NMOS transistors Mcb1 to Mcb4. In this way, it is possible to perform the operation of the detection of disconnection normally.

Note that, the circuits to achieve the additional function stated above will not limited to perform the function to even out the voltage of the plurality of secondary cells, and any circuit which achieves the additional function, such as by connecting the low-value resistances to the each secondary cell, can be applied the third embodiment of the invention.

3.2. Control Signal of the Control Circuit

Figure 11:
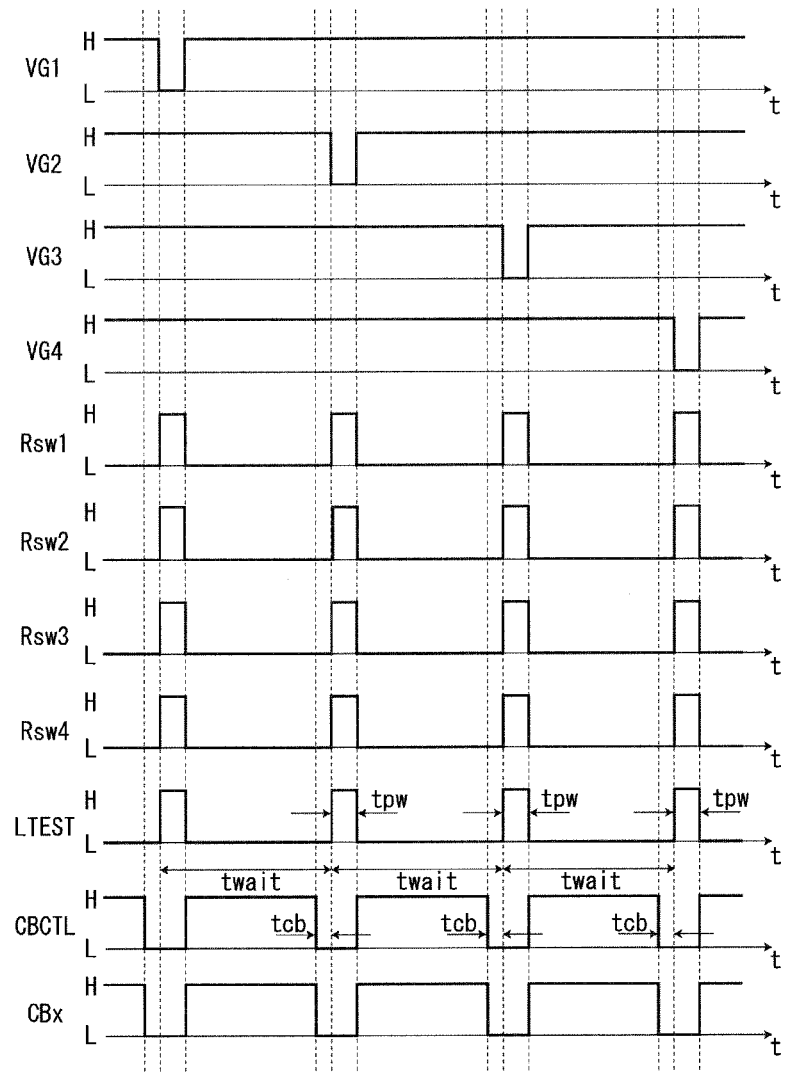
FIG. 11 is a diagram illustrating an example of the control signal of the control circuit in the protective semiconductor device according to the third embodiment of the invention.

FIG. 11 is the diagram illustrating an example of the control signal of the control circuit 210 in the protective semiconductor device according to the third embodiment. The resistances Rcb1 to Rcb4 which are smaller than the resistances R11 to R41 which are smaller than the voltage-sense resistances connected when the operation of the detection of disconnection are connected to the circuit according to the third embodiment shown in FIG. 9 and FIG. 10.

The fundamental performance of the each control signal is the same as each control signal of the control circuit 110 in the protective semiconductor device according to the second embodiment shown in FIG. 6. However, the control circuit 210 switches the control signal CBCTL from "H" to "L" before the time period tpw which is the time the disconnection test signal LTEST turns to "H", in a case of one of the terminals CB1 to CB4 (e.g., terminal CBx) outputting "H" before the disconnection test signal LTEST turns to "H" and hence one of the NMOS transistors connected to the resistance Rcbx turns ON. In response to this, the cell-discharge control circuit 220 forcibly turns output from the terminals CB1 to CB4 to "L" regardless of their states. Shortly after that, when the operation of the detection of disconnection is performed after turning "H" of the disconnection test signal LTEST, the protective semiconductor device according to the third embodiment has become to the same state as the protective semiconductor device according to the first embodiment having no circuits to achieve the additional function as stated above. Note that, tcb expressing the time to control the resistances in advance of the operation of the detection of disconnection is enough that is the time required for the secondary cells and whole circuits to return to the state of the normal operation.

3.3. Operation of the Protective Semiconductor Device

Figure 12:
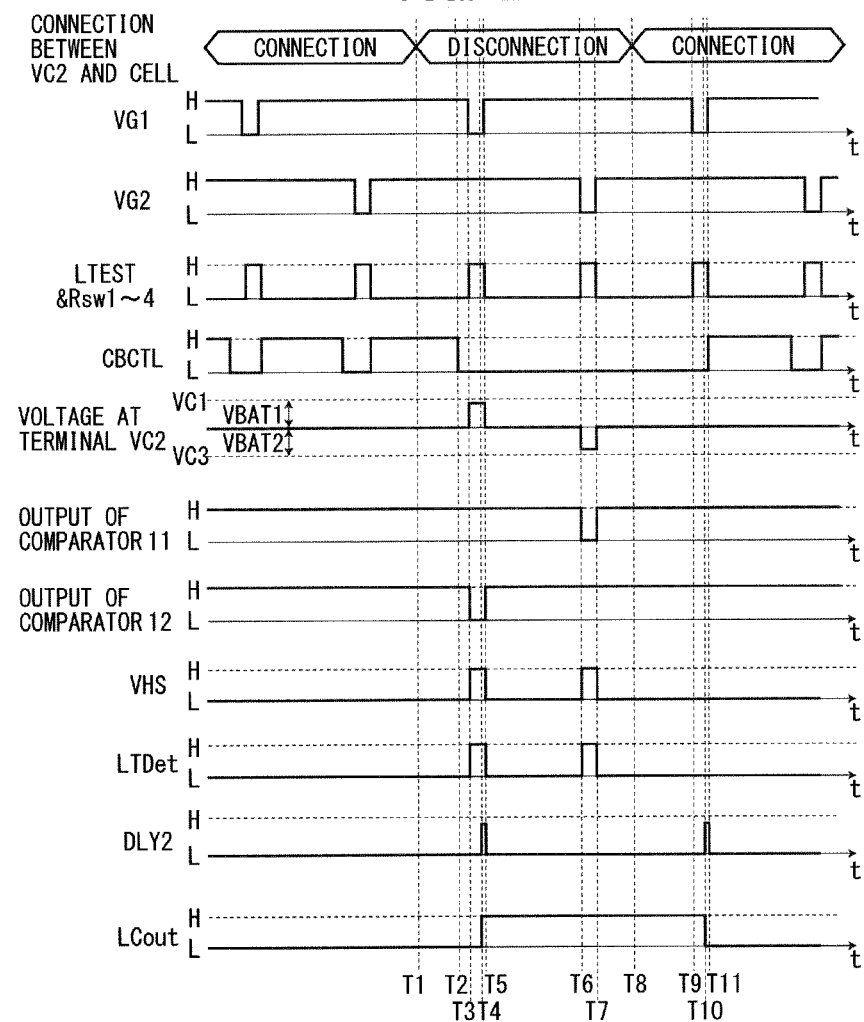
FIG. 12 is an operation timing diagram of the protective semiconductor device according to the third embodiment of the invention.

The operation of the protective semiconductor device according to the third embodiment of the invention will be described hereinafter with reference to FIG. 12, FIG. 9 and FIG. 10. FIG. 12 is an operation timing diagram of the protective semiconductor device according to the third embodiment. In the timing diagram, only necessary signals for the description are shown. The operation of the detection of disconnection is substantially the same as the description by reference with FIG. 8. Also in the timing diagram shown in FIG. 12, an example is illustrated that the protective semiconductor device and the secondary cells are "connected" at first, next "disconnected", and "connected" again at the end. Hereinafter, the operation will be described in the chronological order.

[Time T1:] The time T1 expresses the timing that the secondary cells and the cell-connecting terminal VC2 are disconnected.

[Time T2:] Turning of the control signal CBCTL outputted from the control circuit 210 from "H" to "L" forces the output from the cell-discharge control circuit 220 to turn to "L", and to output "L" to the NMOS transistors Mcb1 to Mcb4 regardless of the state of the voltage-detecting circuits 201 to 204.

[Time T3:] The disconnection test signal LTEST, output from the control circuit 210, is turned from output "L" to output "H", and informs to the judging circuit 120 that the disconnection test is being performed. At the same time, the control signal VG1 has switched from "H" to "L" and the PMOS transistor M1 has became ON. Further, output from the control signals Rsw1 to Rsw4 turns from "L" to "H" and all of the PMOS transistors M11 to M14 have turned OFF. Therefore, the resistance Rs13 is connected in series to the resistances Rail and Rs12, and the resistance R11 is connected in parallel. Further, the resistance Rs23 is connected in series to the resistances Rs21 and Rs22.

The voltage of the cell-connecting terminal VC2 is pulled up in closer to the voltage of the cell-connecting terminal VC1 which is the positive terminal of the secondary cell BAT1. Then, the voltage between the cell-connecting terminals VC2 and VC3 get higher, accordingly, output from the comparator 12 turns "L" expressing the detecting state. As a result, the detection signal VHS which is output from the malfunction-detecting circuit 10 turns from "L" to "H". The AND circuit 124 in the judging circuit 120 leave the high-voltage detecting-operation signal VHDet "L" (the high-voltage detecting is not being performed at this time) even if the detection signal VHS turns from "L" to "H" since the disconnection test is being performed (i.e., output from the disconnection test signal LTEST is "H"). The AND circuit 125 in the judging circuit 120 turns the disconnecting detecting-actuating signal LTDet from "L" to "H" in tandem with that the detection signal VHS turns from "L" to "H".

[Time T4:] The delay circuit 123 in the judging circuit 120 outputs the H-pulse to the delayed output DLY2 when the detection signal VHS has remained "L" until the end of the predetermined period. By outputting of the H-pulse from the delayed output DLY2 of the delay circuit 123 during the disconnection test signal LTEST is "H" and also the detection signal VHS which is output from the malfunction-detecting circuit 10 is "H", the logic circuit B 122 judges that the disconnection has arisen and turns the disconnection-detecting signal LCout to "H" expressing the disconnection-detecting state.

[Time T5:] The disconnection test signal LTEST turns to "L", output from the control signal VG1 turns from "L" to "H", and hence the PMOS transistor M1 return to OFF-state, and output from the control signals Rsw1 to Rsw4 turns from "H" to "L", hence the PMOS transistors M11 to M14 return to ON-state. Thus, the voltage between the cell-connecting terminals VC2 and VC3 returns. Therefore, the detection signal VHS, output from the malfunction-detecting circuit 10, turns (returns) from "H" to "L2, but the disconnection-detecting signal LCout, output from the logic circuit B 122, remains as "H" and stationary since the disconnection test signal LTEST is "L". The control circuit 210 is being inputted the "H" signal of the disconnection-detecting signal LCout, and maintains the "L" state of the control signal CBCTL. Hence, the cell-discharge control circuit 220 continues to output the signal "L" to the NMOS transistors Mcb1 to Mcb4 regardless of the state of the voltage-detecting circuits 201 to 204.

[Time T6:] The disconnection test signal LTEST, output from the control circuit 210, turns from "L" to "H", and informs to the judging circuit 120 that the disconnection test is being performed. At the same time, the control signal VG2 turns from "H" to "L", and the PMOS transistor M2 is turned ON. Moreover, output from the control signals Rsw1 to Rsw4 turns from "L" to "H", and all of the PMOS transistors M11 to M14 are turned OFF. Therefore, the resistance Rs13 is connected in series to the resistances Rs11 and Rs12. Because the resistance Rs23 is connected in series to the resistances Rs21 and Rs22, and the resistance R21 is connected in parallel, the voltage of the cell-connecting terminal VC2 is pulled down closer to the voltage of the cell-connecting terminal VC3 which is a negative terminal of the secondary cell BAT2. Then, while the voltage between the cell-connecting terminals VC2 and VC3 decreases, the voltage between the cell-connecting terminals VC1 and VC2 increases. As a result, the detection signal VHS, which is output from the malfunction-detecting circuit 10, turns from "L" to "H".

Then, during the detection of disconnection is being performed (i.e., the disconnection test signal LTEST is "H"), the detection signal VHS, output from the malfunction-detecting circuit 10, turns from "H" to "L", but the disconnection-detecting signal LCout, output from the logic circuit B 122 is already "H" and stationary.

[Time T7:] In the same way as on the time T5, the disconnection test signal LTEST turns "L", output from the control signal VG1 from "L" to "H", and hence the PMOS transistor M1 returns to OFF-state, and output from the control signals Rsw1 to Rsw4 turns from "H" to "L", and hence the PMOS transistors M11 to M14 return to ON-state. Thus, the voltage between the cell-connecting terminals VC2 and VC3 returns. Therefore, the detection signal VHS, output from the malfunction-detecting circuit 10, turns (returns) from "H" to "L", but the disconnection-detecting signal LCout, output from the logic circuit B 122, remains as "H" and is stationary since the disconnection test signal LTEST is "L". Since the disconnection-detecting signal LCout is "H", the control signal CBCTL remains as "L", and output from the cell-discharge control circuit 220 also remains as "L" forcibly.

[Time T8:] Now, it is assumed that the disconnected spot is fixed.

[Time T9:] Output from the disconnection test signal LTEST, output from the control circuit 210, turns from "L" to "H", and informs to the logic circuit B 122 that the disconnection test is being performed. At the same time, the control signal V61 turns from "H" to "L", and the PMOS transistor M1 is turned ON. Moreover, output from the control signals Rsw1 to Rsw4 turns from "L" to "H" and all of the PMOS transistors M11 to M14 are turned OFF. Therefore, the resistance Rs13 is connected in series to the resistances Rs11 and Rs12, and the resistance R11 is connected in parallel. Further, the resistance Rs23 is connected in series to the resistances Rs21 and Rs22. However, unlike in the time T2 to T3, or time T4 to T5, the voltage between the cell-connecting terminals VC2 and VC3 does not vary from VBAT2 since the cell-connecting terminal VC2 is connected to the secondary cell. Therefore, output from the malfunction-detecting circuit 10 is stationary.

[Time T10:] The delay circuit 123 in the judging circuit 120 outputs the H-pulse to the delayed output DLY2 since the detection signal VHS has remained "L" until the end of the predetermined period. The H-pulse is outputted from the delayed output DLY2 of the delay circuit 123 while the disconnection test signal LTEST is "H" and the detection signal VHS, which is output from the malfunction-detecting circuit 10, is "L". Hence the logic circuit B 122 judges that the protective semiconductor device has returned from the disconnection and turns the disconnection-detecting signal LCout to "L" expressing the returning from disconnection state.

[Time T11:] The disconnection test signal LTEST, output from the control circuit 210, turns from "H" to "L", and informs to the logic circuit B 122 that the disconnection test is finished. At the same time, output from the control signal VG1 turns from "L" to "H", and hence the PMOS transistor M1 return to OFF-state, and output from the control signals Rsw1 to Rsw4 turns from "H" to "L" and hence the PMOS transistors M11 to M14 return to ON-state. In the same way as the time T9, the voltage between the cell-connecting terminals VC2 and VC3 does not vary from VBAT2 because the cell-connecting terminal VC3 is connected to the secondary cells.

Further, the control circuit 210 outputs the control signal CBCTL with switching from "L" to "H" to the cell-discharge control circuit 220 since the signal LCout outputted from the judging circuit 120 turns to "L" and the disconnection test signal LTEST turns to "L". In response to this, if the voltage-detecting circuits 201 to 204 and the protective semiconductor device 1 are in the state in which is possible to output "H" to the NMOS transistors Mcb1 to Mcb4, the cell-discharge control circuit 220 shift into the state to output "H".

The above is an example of the operation of the protective semiconductor device according to the third embodiment when the disconnection between the secondary cells and the cell-connecting terminal VC2 has arisen. With regard to the disconnection of another cell-connecting terminal (e.g., VC3 or VC4) and the secondary cells, the operation of the protective semiconductor device is the same as above in principle and descriptions thereof are omitted.

3.4. Summary of the Third Embodiment

As stated above, in the third embodiment, in the protective semiconductor device for the secondary cells wherein the comparator detecting the fluctuation in voltage is installed to the each secondary cell which are connected in series, the other resistance is sequentially and temporarily connected to the resistances forming the comparators for the each secondary cell, and at that time, the comparator detects the fluctuation in voltage at the each terminal between the secondary cells and the protective semiconductor device. When connecting the resistance stated above in parallel, while the other resistances are connected to the each resistance in series to the resistances forming the comparators for all of the respective secondary cells, hence the inversion level of the comparator get higher. At that time, the resistances connected to the each secondary cell in parallel are disabled. Therefore, the protective semiconductor device enables to function normally the operation of the detection of disconnection between the secondary cells and the each cell-connecting terminal, also related to the secondary cells connected in series having the resistances between the positive and negative terminals of the each secondary cell.

Fourth Embodiment

The protective semiconductor devices according to the first to third embodiments perform the detection of high-voltage and the detection of disconnection. Performing the disconnection-detecting test when the protective semiconductor device is in the high-voltage protection-detecting mode, this state is no longer able to be maintained, the judging circuit 120 controls not to perform the operation of the detection of disconnection during detection of the high-voltage protection.

However, at least one secondary cell comes into an overcharged state due to the disconnection has arisen, and sometimes this causes the protective semiconductor device to shift into the high-voltage protection-detecting mode. In such a case, the test for detecting disconnection (disconnection test operation) is not performed even though the disconnection has arisen, and hence the disconnection is not detected.

Therefore, to the protective semiconductor device according to the fourth embodiment, a following selector circuit is added. The selector circuit does not input the signal of the malfunction-detecting circuit to the circuit maintaining an overcharge detecting mode (the high-voltage protection-detecting mode), and inputs the state maintained at the circuit maintaining the overcharge detecting mode (the high-voltage protection-detecting mode) recursively, when the internal signal expressing that the test for detecting disconnection is being performed (the disconnection test signal LTEST) is ON. As a result, the overcharge detecting mode (the high-voltage protection-detecting mode) can be maintained regardless of whether or not the test for detecting disconnecting is performed, and the detection of disconnecting can be performed in the overcharge detecting mode (the high-voltage protection-detecting mode).

Figure 13:
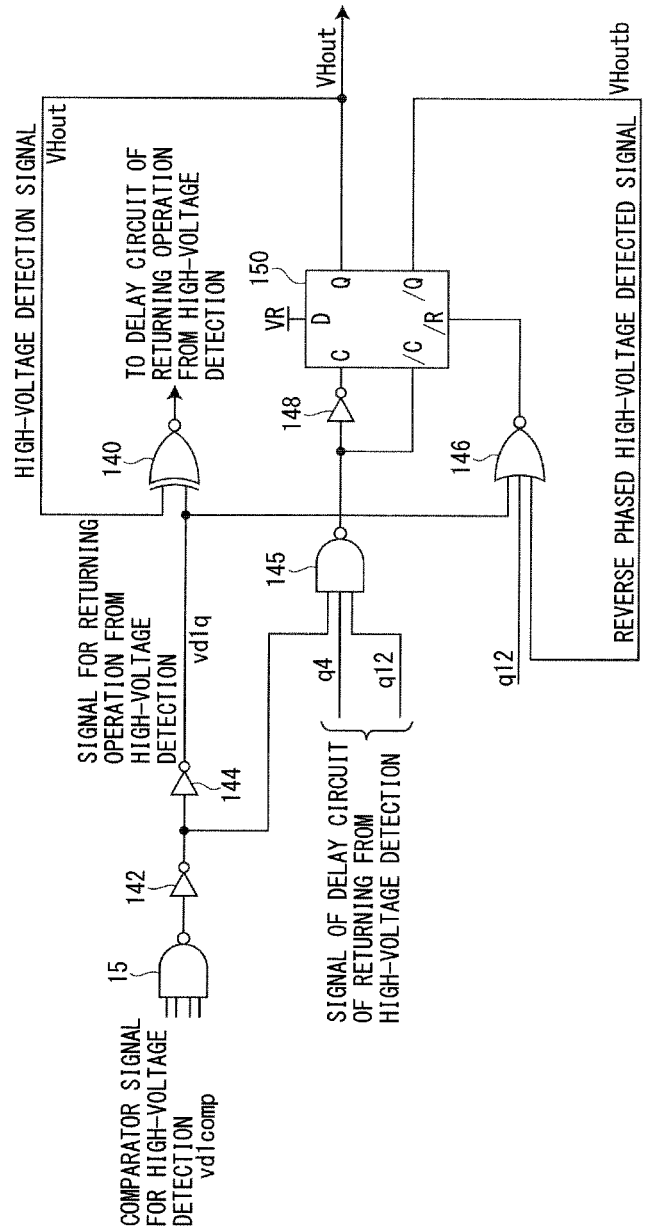
FIG. 13 illustrates a circuit configuration of the input and output parts in the judging circuit of the protective semiconductor device according to the first to third embodiments of the invention.

4.1. Configuration and the Operation of a Part of the Judging Circuit According to the First to Third Embodiments Before the description of the fourth embodiment, the configuration of the part of the circuit, especially, the part of input and output from the judging circuit 120 in the protective semiconductor devices according to the first to third embodiments will be described. FIG. 13 illustrates the circuit configuration of the input and output parts in the judging circuit 120 of the protective semiconductor device according to the first to third embodiments of the invention.

The circuit shown in FIG. 13 includes the NAND circuit 15 included in the malfunction-detecting circuit 10, an exclusive OR circuit 140, a NAND circuit 145, a NOR circuit 146, a flip-flop 150, and inverters 142, 144, 148. The exclusive OR circuit 140 sends a signal to a circuit producing a delay time to returning from the high-voltage detecting included in the delay circuit 123 setting the delay time for returning from the high-voltage detecting, while the output signal of the NAND circuit 15 and the high-voltage detecting signal VHout which is the output signal of the flip-flop 150 are inputted. The input signals of the NAND circuit 145 are two output signals of the delay circuit 123 and an inverted output signal of the NAND circuit 15. The input signals of the NOR circuit 146 are the output signal of the NAND circuit 15, one of the output signals of the delay circuit 123, and a reverse phase signal VHoutb of the high-voltage detecting signal VHout which is the output signal of the flip-flop 150. The input signals of the flip-flop 150 are the output signal of the NAND circuit 145, the inversion signal of the output signal of the NAND circuit 145, and the output signal of the NOR circuit 146, while the output signals of the flip-flop 150 are the high-voltage detecting signal VHout and its reverse phase signal VHoutb.

Hereinafter, the operation of the circuit shown in FIG. 13 will be described. First, a case that the judging circuit 120 does not maintain the high-voltage protection-detecting mode is assumed. In this case, the high-voltage detecting signal which expresses the state exept the high-voltage protection-detecting mode (i.e., VHout="L") in the judging circuit 120 is inputted to one of the input of the exclusive OR circuit 140. The NAND circuit 15 outputs the signal NAND of the comparators 11, 12, 13, 14 for the high-voltage detecting. If output from the at least one comparator turns to the detecting state ("L" state), the "H" signal outputted by the NAND circuit 15 is inputted to another input of the exclusive OR circuit 140. Therefore, the exclusive OR circuit 140 sends the signal "H" to the circuit producing the delay time to returning from the high-voltage detecting depending on output from the NAND circuit 15. After the end of the predetermined (delay) time, if the NAND circuit 15 outputs the signal "H", the high-voltage detecting signal VHout turns "H", and the protective semiconductor device comes into the high-voltage protection-detecting mode.

Next, it is assumed that the judging circuit 120 maintains the high-voltage protection-detecting mode. In this case, the high-voltage detecting signal which expresses the high-voltage protection-detecting mode (I.e., VHout="H") in the judging circuit 120 is inputted to one of the input of the exclusive OR circuit 140. If output from all the comparator becomes normal state ("H" state), the "L" signal outputted by the NAND circuit 15 is inputted to another input of the exclusive OR circuit 140. Therefore, the exclusive OR circuit 140 sends the signal "H" to the circuit producing the delay time to returning from the high-voltage detecting depending on the two inputs. After the end of the predetermined (delay) time, if the NAND circuit 15 is still outputting the signal "L", the high-voltage detecting signal VHout outputted from the judging circuit 120 turns to "L", and the protective semiconductor device returns to the state which is not the high-voltage protection-detecting mode.

Note that, while the judging circuit 120 maintains the high-voltage protection-detecting mode (i.e., VHout="H"), the control circuit 110 shown in FIG. 1, FIG. 5 and FIG. 9 leave the disconnection test signal LTEST "L". Then, in this case, the disconnection test is not performed.

4.2 Configuration of the Protective Semiconductor Device

Figure 14:
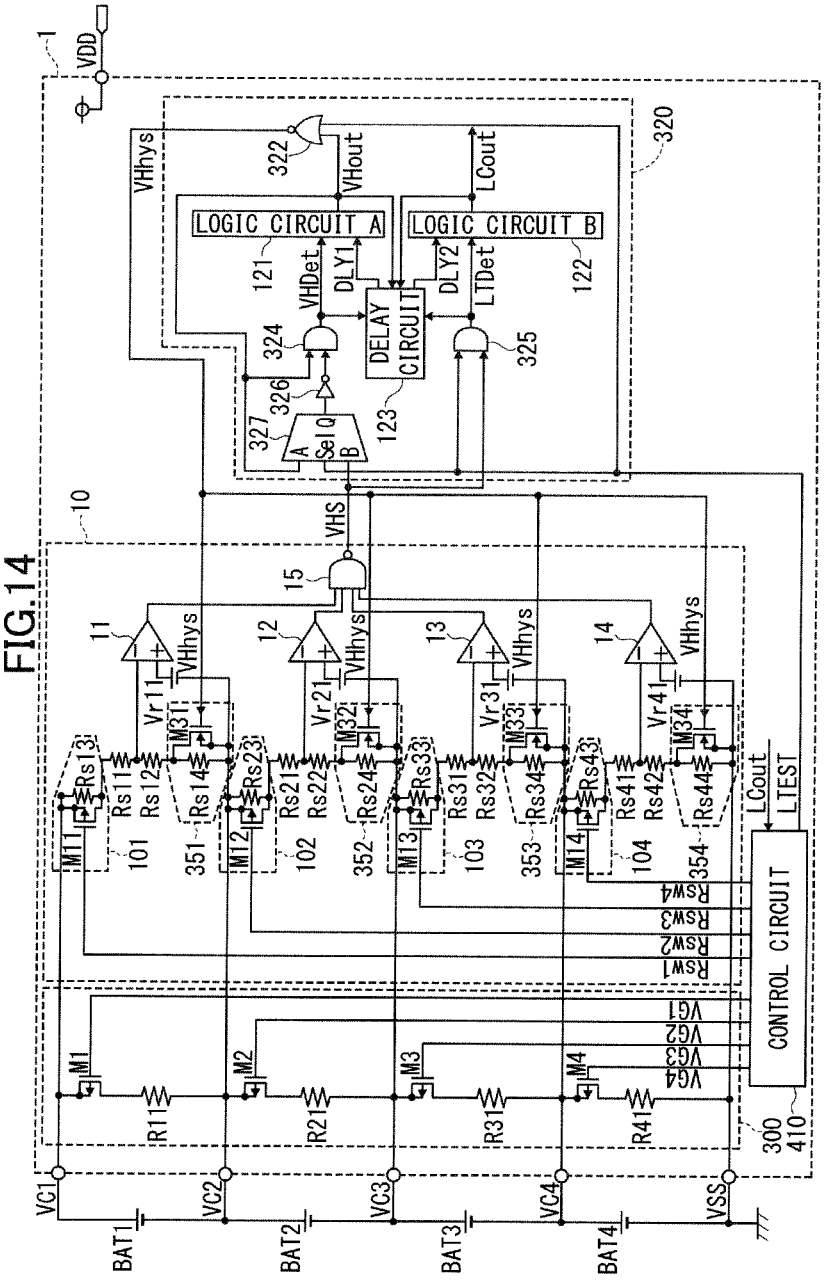
FIG. 14 is a schematic diagram of the protective semiconductor device according to the fourth embodiment of the invention and the secondary cells.

Next, the protective semiconductor device 1 according to the fourth embodiment of the invention will be described. FIG. 14 is the schematic diagram of the protective semiconductor device 1 according to the fourth embodiment of the invention and the secondary cells. The protective semiconductor device according to the fourth embodiment has the configuration substantially similar to the protective semiconductor device according to the second embodiment of the invention. Therefore, the differences between them will be primarily described.

The malfunction-detecting circuit 10 of the protective semiconductor device 1 according to the fourth embodiment includes, the comparators 11, 12, 13, 14, the reference voltage Vr11, Vr21, Vr31, Vr41, the partial resistances Rs11, Rs12, Rs21, Rs22, Rs31, Rs32, Rs41, Rs42, the sense-voltage-changing circuits 101, 102, 103, 104, the NAND circuit 15, and hysteresis-forming circuits 351, 352, 353, 354.

As shown in FIG. 14, the hysteresis-forming circuit 351 is composed of a parallel connection of the resistance Rs14 and the NMOS transistor M31. The other hysteresis-forming circuits 352, 353, 354 are the same.

In the malfunction-detecting circuit 10 of the protective semiconductor device 1 according to the fourth embodiment shown in FIG. 14, the circuit for detecting the high-voltage and the disconnection of the secondary cell BAT1 is composed of the comparator 11, the resistances Rs11, Rs12, Rs14, the NMOS transistor M31 forming the hysteresis, the reference voltage Vr11, and the sense voltage-changing circuit 101. The resistances Rs11, Rs12, Rs14 and the sense voltage-changing circuit 101 are connected in series and further connected between the cell-connecting terminals VC1 and VC2. The connection node of the resistances Rs11 and Rs12 are connected to the inverting input of the comparator 11. The reference voltages Vr11 is connected between the non-inverting input of the comparator 11 and the cell-connecting terminal VC2. Note that, the resistances Rs11 and Rs12 are the voltage-sense resistance to the first secondary cell BAT1.

While the circuit for detecting the high-voltage and the disconnection of the secondary cell BAT1 does not detect the high-voltage, the resistance Rs14 is shunted by turning ON the NMOS transistor M31 in the hysteresis-forming circuits 351. On the other hand, while the high-voltage is detected, the NMOS transistor M31 is turned OFF by the signal for high-voltage hysteresis VHhys (described later). Thus, the resistance Rs14 is inserted between the resistance Rs12 and the cell-connecting terminal VC2. As a result, in the circuit for detecting the high-voltage and the disconnection, the voltage when returning from the high-voltage protection-detecting mode is lower than the voltage when shifting into the high-voltage protection-detecting mode. Namely, the circuit for detecting the high-voltage and the disconnection has hysteresis relating to the high-voltage protection-detecting mode.

The sense voltage-changing circuit 101 in this embodiment has a configuration similar to the sense voltage-changing circuit in the second embodiment. The malfunction-detecting circuits of the second secondary cell BAT2 to the fourth secondary cell BAT4 have the same configurations as the malfunction-detecting circuit of the first secondary cell BAT1.

The control circuit 410 is inputted the disconnection-detecting signal LCout, while outputting the control signals VG1, VG2, VG3, and VG4 to the PMOS transistors M1 to M4 in the internal-resistance-changing circuit 300, and the disconnection test signal LTEST to the judging circuit 320. Further, the control circuit 410 outputs the control signals Rsw1, Rsw2, Rsw3, and Rsw4 to the gates of the PMOS transistors M11 to M14 of the sensed voltage changing circuits 101 to 104 respectively. Moreover, a clock, an external trigger, and so on, which are not shown in drawings, are connected as the input in order to form the control signals VG1 to VG4, the disconnection test signal LTEST, and the control signals Rsw1, Rsw2, Rsw3 and Rsw4.

The judging circuit 320 is a circuit judging whether the malfunction-detecting circuit 10 has detected the high-voltage or the disconnection. The judging circuit 320 includes a selector circuit 327, an AND circuit 324, an AND circuit 325, the logic circuit A 121, the logic circuit B 122, a NOR circuit 322, the delay circuit 123, and an inverter circuit 326.

The judging circuit 320 is inputted the detection signal VHS, which is output from the malfunction-detecting circuit 10 and the disconnection test signal LTEST, while outputting the high-voltage detecting signal VHout, the signal for high-voltage hysteresis VHhys, and the disconnection-detecting signal LCout. The internal configuration of the judging circuit 320 will be described later in detail.

The selector circuit 327 located at the input part of the judging circuit 320 is inputted the high-voltage detecting signal VHout and the detection signal VHS, which is the output (of the NAND circuit 15) of the malfunction-detecting circuit 10, and at least one signal which is selected depending on the state of the disconnection test signal LTEST is outputted.

The AND circuit 324 is inputted the high-voltage detecting signal VHout and the inverted output signal of the selector circuit 327, while outputting the high-voltage detecting-operation signal VHDet. The AND circuit 325 is inputted the detection signal VHS outputted from the malfunction-detecting circuit 10 (NAND circuit 15 thereof) and the disconnection test signal LTEST, while outputting the disconnection detecting-operation signal LTDet.

The logic circuit A 121 is inputted the high-voltage detecting-operation signal VHDet and the delayed output DLY1 outputted from the delay circuit 123, while outputting the high-voltage detecting signal VHout.

The logic circuit B 122 is inputted the disconnection detecting-operation signal LTDet and the delayed output DLY2 outputted from the delay circuit 123, while outputting the disconnection-detecting signal LCout.

The NOR circuit 322 is inputted the high-voltage detecting signal VHout and the disconnection test signal LTEST, while outputting the signal for high-voltage hysteresis VHhys.

The delay circuit 123 is inputted the high-voltage detecting-operation signal VHDet, the disconnection detecting-operation signal LTDet, the high-voltage detecting signal VHout, and the disconnection-detecting signal LCout. Moreover, the delay circuit 123 outputs the delayed output DLY1 to the logic circuit A 121 as its input, and the delayed output DLY2 to the logic circuit B 122 as its input.

The delay circuit 123 is a circuit to set the delay time for the detecting/returning to prevent the false detection by noise and so on. When the malfunction-detecting circuit 10 has detected the high-voltage, the delay circuit 123 starts the operation once the signal VHDet outputted from the AND circuit 124 turns from "L" to "H", and outputs the H-pulse to the output DLY1 if the signal VHDet remains as "H" until the end of the predetermined period. When returning from the high-voltage protection-detecting mode, the delay circuit 123 starts the operation once the signal VHDet outputted from the AND circuit 324 turns from "H" to "L", and outputs the H-pulse when the signal VHDet remains as "L" until the end of the predetermined period. A judgment of the detecting/returning is performed based on the high-voltage detecting signal VHout. For example, it is judged that the high-voltage detecting signal VHout "H" is "detecting" and "L" is "returning".

When the malfunction-detecting circuit 10 has detected the disconnection, the delay circuit 123 starts the operation once the disconnection detecting-operation signal LTDet outputted from the AND circuit 125 turns from "L" to "H", and outputs the H-pulse to the output DLY2 if the signal LTDet remains as "H" until the end of the predetermined period. When returning from the disconnection-detecting mode, the delay circuit 123 starts the operation once the disconnection detecting-operation signal LTDet outputted from the AND circuit 325 turns from "H" to "L", and outputs the H-pulse when the signal LTDet remains as "L" until the end of the predetermined period. A judgment of the detecting/returning is performed based on the disconnection-detecting signal LCout. For example, it is judged that the disconnection-detecting signal LCout "H" is "detecting" and "L" is "returning".

Note that, these predetermined periods for the high-voltage detecting, the returning from high-voltage, the disconnection detecting, and the returning from disconnection need not be same, and can be different each other. Furthermore, the delay circuit 123 can have any configuration such as a counter and a capacitance charging with constant-current if the circuit works in the same way.

4.3. Configuration and the Performance of a Part of the Judging Circuit

Figure 15:
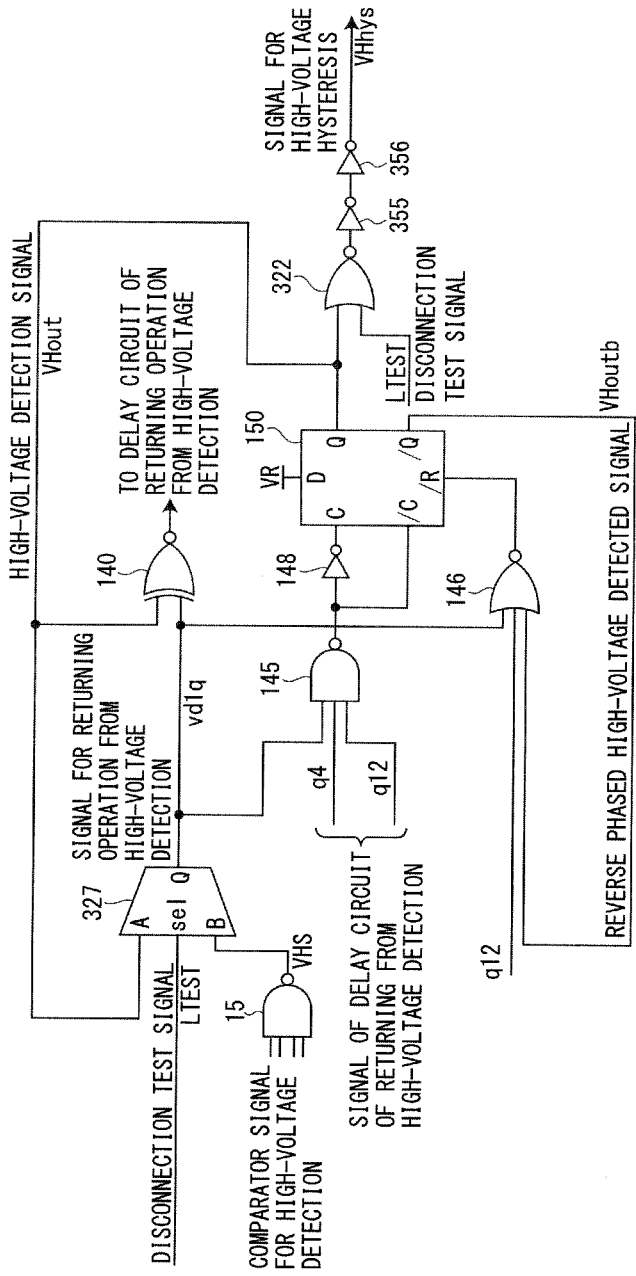
FIG. 15 illustrates a circuit configuration of the input and output parts of the judging circuit of the protective semiconductor device according to the fourth embodiment of the invention.

Next, especially, the configuration of the input and output part of the judging circuit 320 in the protective semiconductor devices according to the fourth embodiment will be described. FIG. 15 illustrates the circuit configuration of the input and output parts of the judging circuit 320 of the protective semiconductor device according to the fourth embodiment.

The circuit shown in FIG. 15 includes the NAND circuit 15 included in the malfunction-detecting circuit 10, the selector circuit 327, the exclusive OR circuit 140, the NAND circuit 145, the NOR circuit 146, the flip-flop 150, the NOR circuit 322 and the inverters 148, 355, 356.

Compared to the part of input and output from the judging circuit 120 of the protective semiconductor device according to the first to third embodiments shown in FIG. 13, the selector circuit 327 is added to the circuit shown in FIG. 15. The selector circuit 327 is inputted the high-voltage detecting signal VHout as a first input, and the output signal from the NAND circuit 15 of the malfunction-detecting circuit 10 as a second input. Further, the disconnection test signal LTEST is inputted to a selecting terminal of the selector circuit 327. The selector circuit 327 outputs the signal inputted to the first input (terminal A shown in FIG. 15) when the signal "H" is inputted to the selecting terminal, and outputs the signal inputted to the second input (terminal B shown in FIG. 15) when the signal "L" is inputted to the selecting terminal. That is to say, the selector circuit 327 outputs the high-voltage detecting signal VHout when the disconnection test signal LTEST is "H" (under the disconnection test), while outputting the output signal from the NAND circuit 15 of the malfunction-detecting circuit 10 when the disconnection test signal LTEST is "L" (not under the disconnection test).

The exclusive OR circuit 140 sends the signal to the circuit producing the delay time to return to the high-voltage detecting included in the delay circuit 123 setting the delay time to returning from the high-voltage detecting, while the output signal of the selector circuit 327 and the high-voltage detecting signal VHout which is the output signal of the flip-flop 150 are inputted. The NAND circuit 145 is inputted the two output signals of the delay circuit 123 and the output signal of the selector circuit 327. The NOR circuit 146 is inputted the output signal of the NAND circuit 15, the output signals of the delay circuit 123, and the reverse phase signal VHoutb of the high-voltage detecting signal VHout which is the output signal of the flip-flop 150. The flip-flop 150 is inputted the output signal of the NAND circuit 145, the inverted output signal of the NAND circuit 145, and the output signal of the NOR circuit 146, while outputting the high-voltage detecting signal VHout and its reverse phase signal, the high-voltage detecting signal VHoutb.

Hereinafter, the operation of the circuit shown in FIG. 15 will be described. First, when the disconnection test is not being performed (i.e., the disconnection test signal LTEST="L"), the signal "L" is inputted to the selecting terminal of the selector circuit 327, the output signal from the NAND circuit 15 of the malfunction-detecting circuit 10 which is inputted to the terminal B (second input) of the selector circuit 327 is outputted from the selector circuit 327. Therefore, when the disconnection test is not being performed, the protective semiconductor device according to the fourth embodiment can come into the high-voltage protection-detecting mode and return from the high-voltage protection-detecting mode just like the protective semiconductor device according to the first to third embodiments.

When the disconnection test is being performed (i.e., the disconnection test signal LTEST="H"), the signal "H" is inputted to the selecting terminal of the selector circuit 327, and the high-voltage detecting signal VHout which is inputted to the terminal A (first input) of the selector circuit 327 is outputted from the selector circuit 327. At that time, in-phase signals are inputted to the both terminals of the exclusive OR circuit 140 located after the selector circuit 327. That is to say, the signals "H" are inputted to the both terminals of the exclusive OR circuit 140 when the high-voltage detecting signal is in the high-voltage protection-detecting mode (VHout="H"), while the signals "L" are inputted to the both terminals when the high-voltage detecting signal is not in the high-voltage protection-detecting mode (VHout="L"). Since the exclusive OR circuit 140 outputs the signal "L" at that time, the circuit located after which produces the delay time to returning from the high-voltage detecting does not perform. Since the circuit producing the delay time to returning from the high-voltage detecting does not performs, the high-voltage detecting signal VHout does not varies.

Namely, even if the disconnection detecting is performed and thus output from the malfunction-detecting circuit 10 varies, since the circuit producing the delay time to returning from the high-voltage detecting does not performs, the high-voltage detecting signal VHout does not varies. Therefore, the high-voltage protection-detecting mode is maintained at the flip-flop 150, even if the disconnection-detecting test is performed when the protective semiconductor device is in the high-voltage protection-detecting mode. Thus, there is no need to control not to perform the operation of the detection of disconnection during detecting the protection from the high-voltage by the judging circuit 320.

The following Table 1 expresses correlations of the high-voltage detecting signal VHout, the disconnection test signal LTEST, and output from the selector circuit 327 (vd1q). Note that, a word "VHS" expresses the output signal of the NAND circuit 15.

TABLE 1

| VHout | LTEST | vd1q |
|---|---|---|
| L | L | VHS |
| H | L | VHS |
| L | H | L |
| H | H | H |

Moreover, a circuit forming the hysteresis (VHhys) to the high-voltage detecting signal VHout composed of the inverters 355 and 356 is connected after the flip-flop 150 in the circuit shown in FIG. 15. Just before this circuit, the NOR circuit 322 is arranged. The high-voltage detecting signal VHout and the disconnection test signal LTEST are inputted to the NOR circuit 322. The signal for the high-voltage hysteresis is fixed to "L" by this NOR circuit 322 during the disconnection-detecting test (i.e., LTEST="H") regardless of the state of the high-voltage detecting signal VHout. As a result, the NMOS transistors M31, M32, M33, M34 of the hysteresis-forming circuits 351, 352, 353, 354 are turned ON, and the hysteresis-forming circuits 351, 352, 353, 354 are shunted. That is to say, the NOR circuit 322 controls the threshold voltage expressing whether or not the disconnection has arisen (especially, the voltage of returning from the state of detecting disconnection) not to decrease due to the hysteresis of the high-voltage detecting signal. As a result, the threshold voltage expressing whether or not the disconnection has arisen is maintained constant regardless of the state of the high-voltage detecting signal just before the detecting disconnection test, and the false detection of the disconnected state is prevented.

The following Table 2 expresses the correlations of the high-voltage detecting signal VHout, the disconnection test signal LTEST, and the signal for high-voltage hysteresis VHhys.

TABLE 2

| VHout | LTEST | VHhys |
|---|---|---|
| L | L | L |
| L | H | L |
| H | L | L |
| H | H | H |

4.4. Summary of the Forth Embodiment

As stated above, in the fourth embodiment, in the protective semiconductor device for the secondary cells wherein the comparator detecting the fluctuation in voltage is installed to the each secondary cell which are connected in series, the resistances are connected sequentially and temporarily corresponding to the each secondary cell to the resistances forming the comparators for the each secondary cell. Then, the fluctuation in voltage at the each cell-connecting terminal between the each secondary cell and the protective semiconductor device is detected by the comparator. The protective semiconductor device includes a circuit which maintains the state of the signal at just before the detection of disconnection between the secondary cell and the protective semiconductor device during the operation of the detection. The state of signal is expresses whether at least one secondary cell is high-voltage or not. In this way, the high-voltage protection-detecting mode is maintained even if the detecting disconnection test is performed when the protective semiconductor device is in the high-voltage protection-detecting mode.

As stated above, by utilizing the present invention, an occurrence of a disconnection is reliably detected if a part of connection between the secondary cells and the protective semiconductor device is disconnected while using the secondary cells.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. A protective semiconductor device capable of detecting a voltage state of a plurality of secondary cells connected in series, comprising:
    connecting terminals which are connectable to a electrode of each secondary cell;
    first resistances detecting the voltage of each of secondary cells which are arranged corresponding to each secondary cell and connected between the terminals corresponding to each electrode of a high-pressure side and low-pressure side;
    comparators which are arranged corresponding to each secondary cell and capable of detecting whether or not the voltage of each of the secondary cells is in reference voltage range based on the voltages obtained from the first resistances;
    series circuits each composed of a second resistance and a first switch element which are arranged corresponding to each secondary cell and connected between the connecting terminals; and
    a control circuit controlling ON/OFF of the each first switch element,
    the first switch element connecting the second resistance between the connecting terminals by turning ON, while disconnecting the second resistance from the connecting terminals by turning OFF, and the control circuit turning ON the plurality of first switch elements sequentially while remaining in an ON-state of a disconnection test signal and detecting the disconnection between the secondary cells and the connecting terminals based on the output signal from the comparator corresponding to the first switch element turned ON;
    further comprising third resistances corresponding to each of first resistances and the second switch element switching connect/disconnect of the third resistance between each connecting terminal and the first resistance, wherein the control circuit changes the reference voltage level of detection criterion of the comparator by a sending signal to control a second switch element to connect the third resistance while the disconnection test signal remains in the ON-state.

2. The protective semiconductor device according to claim 1, wherein the comparators detect whether or not the voltage of each secondary cell is higher than the reference voltage.

3. The protective semiconductor device according to claim 1, wherein the comparators detect whether or not the voltage of each secondary cell is lower than the reference voltage.

4. The protective semiconductor device according to claim 1 performing only the detection of disconnection between the secondary cells and the connecting terminals when the control circuit maintains the ON-state of the disconnection test signal.

5. The protective semiconductor device according to claim 1, wherein if the comparator detects that the voltage of a corresponding secondary cell is out of reference voltage range when the control circuit maintains the OFF-state of the disconnection test signal, the control circuit continues to maintain the OFF-state of the disconnection test signal as long as the detection continues.

6. The protective semiconductor device according to claim 1, further comprising fourth resistances and third switch elements switching a connect/disconnect of each fourth resistance which are connected between each terminal of a high-pressure side and low-pressure side of secondary cells, wherein the control circuit sends a signal to control the third switch element to the third switch element such that the fourth resistance is disconnected from the predetermined period before turning ON the disconnection test signal until the end of the ON-state of the disconnection test signal.

* * * * *